US012719448B2

(12) United States Patent
Daimon et al.

(10) Patent No.: US 12,719,448 B2
(45) Date of Patent: Aug. 25, 2026

(54) ACOUSTIC WAVE DEVICE

(71) Applicant: Murata Manufacturing Co., Ltd., Nagaokakyo (JP)

(72) Inventors: Katsuya Daimon, Nagaokakyo (JP); Sho Nagatomo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 77 days.

(21) Appl. No.: 18/978,016

(22) Filed: Dec. 12, 2024

(65) Prior Publication Data

US 2025/0112622 A1 Apr. 3, 2025

Related U.S. Application Data

(63) Continuation of application No. PCT/JP2023/028486, filed on Aug. 3, 2023.

(60) Provisional application No. 63/394,721, filed on Aug. 3, 2022.

(51) Int. Cl.

*H03H 9/56* (2006.01)
*H03H 9/02* (2006.01)
*H03H 9/13* (2006.01)

(52) U.S. Cl.

CPC ........ *H03H 9/568* (2013.01); *H03H 9/02015* (2013.01); *H03H 9/02086* (2013.01); *H03H 9/132* (2013.01)

(58) Field of Classification Search

CPC ............... H03H 9/568; H03H 9/02015; H03H 9/02086; H03H 9/132

See application file for complete search history.

(56) References Cited

U.S. PATENT DOCUMENTS

| | | | |
|---|---|---|---|
| 10,491,192 B1 | 11/2019 | Plesski et al. | |
| 2017/0310305 A1* | 10/2017 | Komura | H03H 9/64 |
| 2020/0021272 A1 | 1/2020 | Segovia Fernandez et al. | |
| 2020/0280302 A1* | 9/2020 | Miyamoto | H03H 9/1457 |
| 2022/0123727 A1* | 4/2022 | Reinhardt | H03H 9/02228 |
| 2022/0216844 A1 | 7/2022 | Yamane et al. | |

(Continued)

FOREIGN PATENT DOCUMENTS

| | | |
|---|---|---|
| JP | S61234114 A | 10/1986 |
| JP | H0774582 A | 3/1995 |

(Continued)

OTHER PUBLICATIONS

International Search Report in PCT/JP2023/028486, mailed Oct. 17, 2023, 6 pages.

(Continued)

*Primary Examiner* — Samuel S Outten

(74) *Attorney, Agent, or Firm* — Keating & Bennett, LLP

(57) ABSTRACT

An acoustic wave device includes a piezoelectric layer, first and second comb-shaped electrodes respectively including first and second electrode fingers, and a reference potential electrode including third electrode fingers. An order in which the first, second, and third electrode fingers are arranged is the first electrode finger, the third electrode finger, the second electrode finger, and the third electrode finger and defines one period. A pair of reflectors sandwich a region where the first electrode finger, the second electrode finger, and the third electrode finger are provided in an electrode finger orthogonal direction.

20 Claims, 14 Drawing Sheets

(56) References Cited

U.S. PATENT DOCUMENTS

| | | | | |
|---|---|---|---|---|
| 2022/0247378 | A1 * | 8/2022 | Chang | H03H 9/02228 |
| 2023/0198495 | A1 | 6/2023 | Ouchi | |
| 2023/0327639 | A1 | 10/2023 | Inoue | |

FOREIGN PATENT DOCUMENTS

| | | | |
|---|---|---|---|
| JP | 2012257019 | A | 12/2012 |
| WO | 2021060513 | A1 | 4/2021 |
| WO | 2022019072 | A1 | 1/2022 |
| WO | 2022044869 | A1 | 3/2022 |
| WO | 2022138328 | A1 | 6/2022 |

OTHER PUBLICATIONS

Written Opinion in PCT/JP2023/028486, mailed Oct. 17, 2023, 5 pages.

* cited by examiner

ACOUSTIC WAVE DEVICE

CROSS REFERENCE TO RELATED APPLICATIONS

This application claims the benefit of priority to Provisional Application No. 63/394,721 filed on Aug. 3, 2022 and is a Continuation of Application PCT Application No. PCT/JP2023/028486 filed on Aug. 3, 2023. The entire contents of each application are hereby incorporated herein by reference.

BACKGROUND OF THE INVENTION

1. Field of the Invention

The present invention relates to acoustic wave devices.

2. Description of the Related Art

Acoustic wave devices have heretofore been widely used in filters for mobile phones and the like. An acoustic wave device using bulk waves in a thickness-shear mode has recently been proposed, as described in U.S. Pat. No. 10,491,192. In this acoustic wave device, a piezoelectric layer is provided on a support. A pair of electrodes are provided on the piezoelectric layer. The pair of electrodes face each other on the piezoelectric layer and are connected to different potentials. An AC voltage is applied between the electrodes to excite bulk waves in the thickness-shear mode.

An acoustic wave device is, for example, an acoustic wave resonator, and is used in a ladder filter, for example. In order to obtain good characteristics in the ladder filter, the electrostatic capacitance ratio needs to be increased between a plurality of acoustic wave resonators. In this case, the electrostatic capacitances of some of the acoustic wave resonators in the ladder filter need to be increased.

In order to increase the electrostatic capacitance of the acoustic wave resonator, the acoustic wave resonator needs to be increased in size. For this reason, in the case of using such an acoustic wave resonator in a ladder filter, the ladder filter tends to be increased in size. In particular, a ladder filter having an acoustic wave resonator that uses a thickness-shear mode bulk wave with a small electrostatic capacitance tends to be increased in size.

The inventors of example embodiments of the present invention have discovered that when an acoustic wave device is used in a filter device, providing the following configuration of the acoustic wave device can obtain a suitable filter waveform without increasing the size. In this configuration, an electrode connected to a reference potential is located between an electrode connected to an input potential and an electrode connected to an output potential.

The inventors of example embodiments of the present invention have also discovered that simply providing the above configuration may not be enough to reduce insertion loss.

SUMMARY OF THE INVENTION

Example embodiments of the present invention provide acoustic wave devices each achieving miniaturization of a filter device and reducing insertion loss.

An acoustic wave device according to an example embodiment of the present invention includes a piezoelectric layer made of lithium niobate, a first comb-shaped electrode on the piezoelectric layer, including a first busbar and a plurality of first electrode fingers each including one end connected to the first busbar, and being connected to an input potential, a second comb-shaped electrode on the piezoelectric layer, including a second busbar and a plurality of second electrode fingers each including one end connected to the second busbar and interdigitated with the plurality of first electrode fingers, and being connected to an output potential, and a reference potential electrode including a plurality of third electrode fingers on the piezoelectric layer so as to be aligned with the first electrode fingers and the second electrode fingers in a direction in which the first electrode fingers and the second electrode fingers are aligned, and a connection electrode connecting adjacent third electrode fingers, the reference potential electrode being connected to a reference potential. The first electrode finger, the second electrode finger, and the third electrode finger are arranged such that, starting from the first electrode finger, the first electrode finger, the third electrode finger, the second electrode finger, and the third electrode finger define one period. The acoustic wave device includes a pair of reflectors, each including at least one reflector electrode finger on the piezoelectric layer and sandwiching a region where the first electrode finger, the second electrode finger, and the third electrode finger are provided in an electrode finger orthogonal direction orthogonal or substantially orthogonal to a direction in which the first electrode finger, the second electrode finger, and the third electrode finger extend.

Example embodiments of the present invention provide acoustic wave devices each achieving miniaturization of a filter device and reducing insertion loss.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

The present invention will be clarified below by describing specific example embodiments of the present invention with reference to the drawings.

The example embodiments described in this specification are illustrative, and partial substitution or combination of configurations is possible between different example embodiments.

Figure 1:
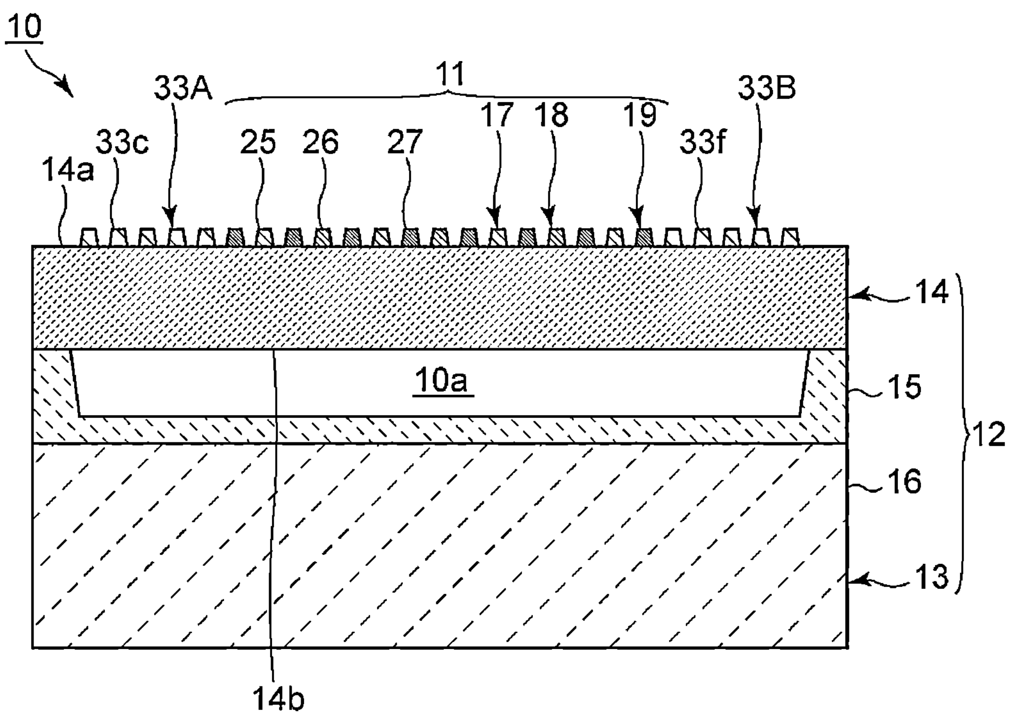
FIG. 1 is a schematic elevational cross-sectional view of an acoustic wave device according to a first example embodiment of the present invention.
Figure 2:
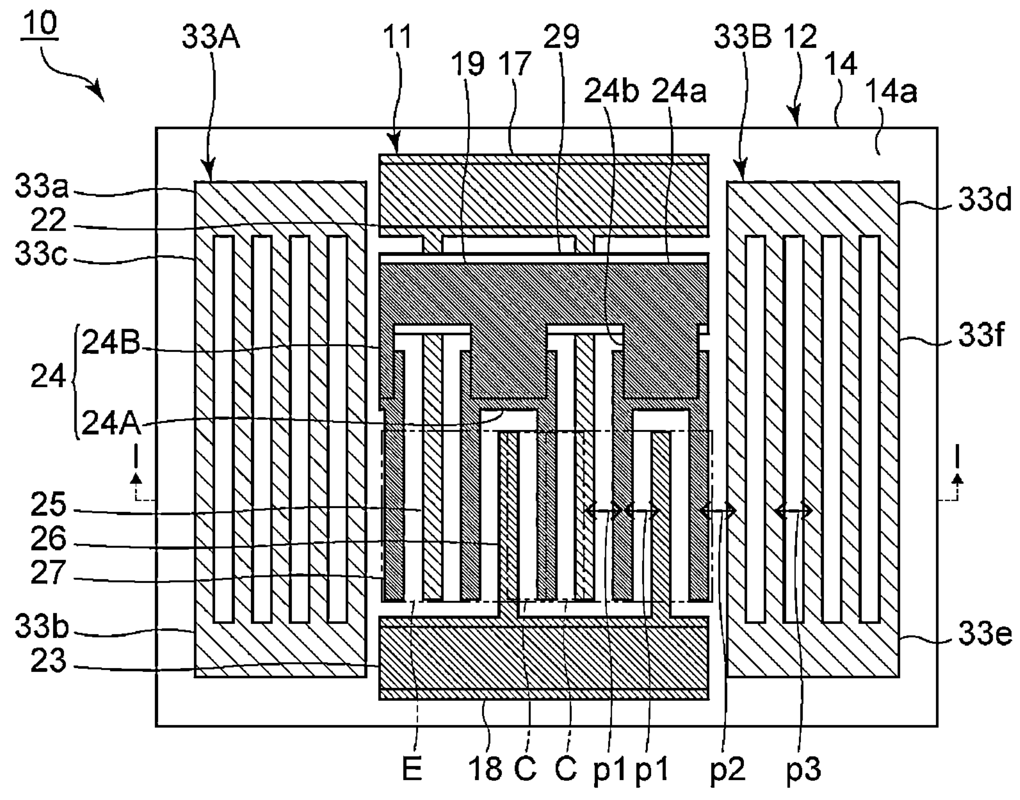
FIG. 2 is a schematic plan view of the acoustic wave device according to the first example embodiment of the present invention.

FIG. 1 is a schematic elevational cross-sectional view of an acoustic wave device according to a first example embodiment of the present invention. FIG. 2 is a schematic plan view of the acoustic wave device according to the first example embodiment. Note that FIG. 1 is a schematic cross-sectional view taken along line I-I in FIG. 2. In FIG. 2, each electrode is illustrated with hatching. Electrodes may also be hatched in schematic plan views other than FIG. 2.

An acoustic wave device 10 illustrated in FIG. 1 is configured to be able to use a thickness-shear mode. The acoustic wave device 10 is, for example, an acoustically coupled filter. The configuration of the acoustic wave device 10 will be described below.

The acoustic wave device 10 includes a piezoelectric substrate 12 and a functional electrode 11. The piezoelectric substrate 12 has piezoelectricity. Specifically, the piezoelectric substrate 12 includes a support 13 and a piezoelectric layer 14. In the present example embodiment, the support 13 includes a support substrate 16 and an insulating layer 15. The insulating layer 15 is provided on the support substrate 16. The piezoelectric layer 14 is provided on the insulating layer 15. However, the support 13 may include the support substrate 16 only. The support 13 does not necessarily have to be provided.

The piezoelectric layer 14 includes a first main surface 14*a* and a second main surface 14*b*. The first main surface 14*a* and the second main surface 14*b* face each other. Of the first main surface 14*a* and the second main surface 14*b*, the second main surface 14*b* is located on the support 13 side.

The piezoelectric layer 14 is made of, for example, lithium niobate. More specifically, in the present example embodiment, for example, the lithium niobate used for the piezoelectric layer 14 is $LiNbO_3$. Euler angles (φ, θ, ψ) of this $LiNbO_3$ are (0°, 0°, 90°). However, the Euler angles (φ, θ, ψ) of the piezoelectric layer 14 are not limited to the above. In this specification, a certain member being made of a certain material includes a case where a trace amount of impurities is included to the extent that the electrical characteristics of the acoustic wave device are not deteriorated.

A functional electrode 11 is provided on the first main surface 14*a* of the piezoelectric layer 14. As illustrated in FIG. 2, the functional electrode 11 includes a pair of comb-shaped electrodes and a reference potential electrode 19. The reference potential electrode 19 is connected to a reference potential. The pair of comb-shaped electrodes are specifically a first comb-shaped electrode 17 and a second comb-shaped electrode 18. The first comb-shaped electrode 17 is connected to an input potential. The second comb-shaped electrode 18 is connected to an output potential.

The first comb-shaped electrode 17 and the second comb-shaped electrode 18 are provided on the first main surface 14*a* of the piezoelectric layer 14. The first comb-shaped electrode 17 includes a first busbar 22 and a plurality of first electrode fingers 25. The plurality of first electrode fingers 25 each include one end connected to the first busbar 22. The second comb-shaped electrode 18 includes a second busbar 23 and a plurality of second electrode fingers 26. The plurality of second electrode fingers 26 each include one end connected to the second busbar 23.

The first busbar 22 and the second busbar 23 face each other. The plurality of first electrode fingers 25 and the plurality of second electrode fingers 26 are interdigitated with each other. The first electrode fingers 25 and the second electrode fingers 26 are alternately arranged in a direction orthogonal or substantially orthogonal to a direction in which the first electrode fingers 25 and the second electrode fingers 26 extend.

The reference potential electrode 19 includes a third busbar 24 as a connection electrode and a plurality of third electrode fingers 27. The plurality of third electrode fingers 27 are provided on the first main surface 14*a* of the piezoelectric layer 14. The plurality of third electrode fingers 27 extend parallel to the plurality of first electrode fingers 25 and the plurality of second electrode fingers. Hereinafter, the direction in which the first electrode fingers 25, the second electrode fingers 26, and the third electrode fingers 27 extend will be referred to as an electrode finger extending direction, and the direction orthogonal or substantially orthogonal to the electrode finger extending direction will be referred to as an electrode finger orthogonal direction. In this specification, the first electrode fingers 25, the second electrode fingers 26, and the third electrode fingers 27 may be collectively referred to simply as electrode fingers.

The third electrode fingers 27 are provided so as to be aligned with the first electrode fingers 25 and the second electrode fingers 26 in the direction in which the first electrode fingers 25 and the second electrode fingers 26 are arranged. Thus, the first electrode fingers 25, the second electrode fingers 26, and the third electrode fingers 27 are arranged in one direction. When the direction in which the first electrode fingers 25, the second electrode fingers 26, and the third electrode fingers 27 are arranged is referred to as an electrode finger arrangement direction, the electrode finger arrangement direction is parallel or substantially parallel to the electrode finger orthogonal direction. Two of the third electrode fingers 27 are located at both end portions in the electrode finger orthogonal direction in the region where the plurality of electrode fingers are provided. The plurality of third electrode fingers 27 other than the two third electrode fingers 27 are provided between the first electrode fingers 25 and the second electrode fingers 26.

Figure 3:
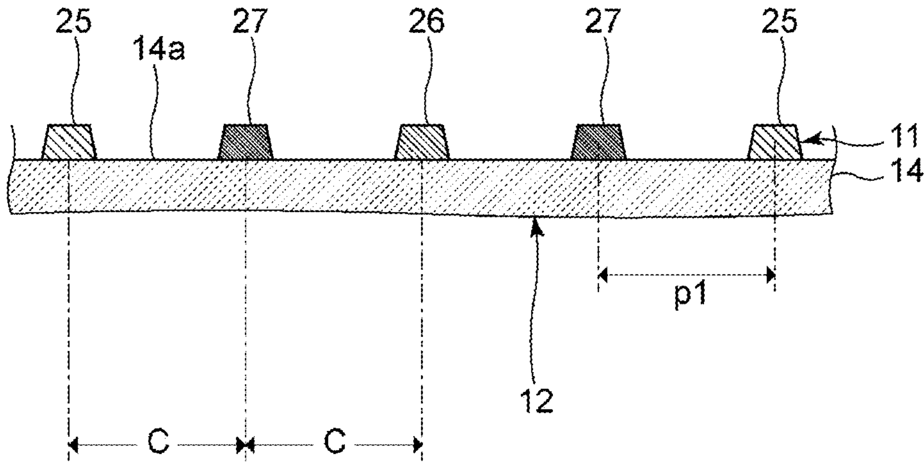
FIG. 3 is a schematic elevational cross-sectional view illustrating the vicinity of first to third electrode fingers in the first example embodiment of the present invention.

FIG. 3 is a schematic elevational cross-sectional view illustrating the vicinity of the first to third electrode fingers in the first example embodiment.

The plurality of electrode fingers are arranged as follows. Specifically, starting from the first electrode finger 25, one period includes the first electrode finger 25, the third electrode finger 27, the second electrode finger 26, and the third electrode finger 27. Therefore, the order in which the plurality of electrode fingers are arranged is the first electrode finger 25, the third electrode finger 27, the second electrode finger 26, the third electrode finger 27, the first electrode finger 25, the third electrode finger 27, the second electrode finger 26, . . . and so on. The order of the plurality of electrode fingers is represented as the order of the potentials to be connected, IN, GND, OUT, GND, IN, GND, OUT, . . . and so on, where IN represents the input potential, OUT represents the output potential, and GND represents the reference potential.

In the present example embodiment, in the region where the plurality of electrode fingers are provided, the electrode fingers located at both end portions in the electrode finger orthogonal direction are the third electrode fingers 27. The electrode fingers located at the end portions in the electrode finger orthogonal direction may be any of the first electrode fingers 25, the second electrode fingers 26, and the third electrode fingers 27.

As illustrated in FIG. 2, the third busbar 24 as the connection electrode for the reference potential electrode 19 electrically connects the plurality of third electrode fingers 27 to each other. Specifically, the third busbar 24 is located in a region between the first busbar 22 and leading end portions of the plurality of second electrode fingers 26. The plurality of first electrode fingers 25 are also located in this region. The third busbar 24 and the plurality of first electrode fingers 25 are electrically insulated from each other by the insulating film 29.

More specifically, the third busbar 24 includes a plurality of first connection electrodes 24A and one second connection electrode 24B. Each of the first connection electrodes 24A connects leading end portions of two adjacent third electrode fingers 27. The first connection electrode 24A and the two third electrode fingers 27 define a U-shaped electrode. The second connection electrode 24B connects the plurality of first connection electrodes 24A to each other. The insulating film 29 is provided between this second connection electrode 24B and the plurality of first electrode fingers 25.

To be more specific, the insulating film 29 is provided on the first main surface 14*a* of the piezoelectric layer 14 so as to partially cover the plurality of first electrode fingers 25. The insulating film 29 is provided in the region between the first busbar 22 and the leading end portions of the plurality of second electrode fingers 26. The insulating film 29 has a strip shape.

The insulating film 29 does not extend to the first connection electrode 24A of the reference potential electrode 19. The second connection electrode 24B is provided on the insulating film 29 and over the plurality of first connection electrodes 24A. Specifically, the second connection electrode 24B includes a bar portion 24*a* and a plurality of protrusions 24*b*. Each protrusion 24*b* extends from the bar portion 24*a* toward each of the first connection electrodes 24A. Each protrusion 24*b* is connected to each of the first connection electrodes 24A. The third electrode fingers 27 are thus electrically connected to each other by the first connection electrode 24A and the second connection electrode 24B.

In the present example embodiment, the third busbar 24 is located in the region between the first busbar 22 and the leading end portions of the plurality of second electrode fingers 26. Therefore, the leading end portions of the plurality of second electrode fingers 26 face the third busbar 24 with a gap therebetween in the electrode finger extending direction. On the other hand, the leading end portions of the plurality of first electrode fingers 25 face the second busbar 23 with a gap therebetween in the electrode finger extending direction.

The third busbar 24 may be located in a region between the second busbar 23 and the leading end portions of the plurality of first electrode fingers 25. In this case, the leading end portions of the plurality of first electrode fingers 25 each face the third busbar 24 with a gap therebetween. On the other hand, the leading end portions of the plurality of second electrode fingers 26 face the first busbar 22 with a gap therebetween.

The acoustic wave device 10 is an acoustic wave resonator configured to be able to use a thickness-shear mode bulk wave. As illustrated in FIG. 2, the acoustic wave device 10 includes a plurality of excitation regions C. In the plurality of excitation regions C, the thickness-shear mode bulk waves and acoustic waves in other modes are excited. FIG. 2 illustrates only two of the excitation regions C.

Some of the plurality of excitation regions C are regions where the adjacent first electrode finger 25 and third electrode finger 27 overlap when viewed from the electrode finger orthogonal direction, and also regions between the centers of the adjacent first electrode finger 25 and third electrode finger 27. The remainder of the excitation regions C are regions where the adjacent second electrode finger 26 and third electrode finger 27 overlap when viewed from the electrode finger orthogonal direction, and also regions between the centers of the adjacent second electrode finger 26 and third electrode finger 27. These excitation regions C are arranged in the electrode finger orthogonal direction.

The configuration of the functional electrode 11, except for the reference potential electrode 19, is the same or substantially the same as that of an interdigital transducer (IDT) electrode. When viewed from the electrode finger orthogonal direction, the region where the adjacent first electrode finger 25 and second electrode finger 26 overlap is an intersection region E. The intersection region E includes a plurality of excitation regions C. Hereinafter, the dimension of the intersection region E along the electrode finger orthogonal direction will be referred to as an intersection width Ap. The intersection region E and the excitation region C are regions of the piezoelectric layer 14 defined based on the configuration of the functional electrode 11.

In the present example embodiment, in the functional electrode 11, the center-to-center distance between a plurality of pairs of first electrode fingers 25 and third electrode fingers 27 adjacent to each other is the same or substantially the same as the center-to-center distance between a plurality of pairs of second electrode fingers 26 and third electrode fingers 27 adjacent to each other. Hereinafter, p1 represents the center-to-center distance between adjacent electrode fingers of the functional electrode 11.

The present example embodiment includes a pair of reflectors 33A and 33B provided on the piezoelectric layer 14 so as to sandwich the region where the first electrode finger 25, the second electrode finger 26, and the third electrode finger 27 are provided in the electrode finger orthogonal direction. This makes it possible to achieve miniaturization of a filter device and reduce insertion loss when the acoustic wave device 10 is used in the filter device. These advantageous effects will be described in detail below together with the configuration of each reflector.

The reflector 33A includes a first reflector busbar 33*a*, a second reflector busbar 33*b*, and a plurality of reflector electrode fingers 33*c*. The first reflector busbar 33*a* and the second reflector busbar 33*b* face each other. The plurality of reflector electrode fingers 33*c* each include one end connected to the first reflector busbar 33*a*. The plurality of reflector electrode fingers 33*c* each include the other end connected to the second reflector busbar 33*b*. Similarly, the reflector 33B also includes a first reflector busbar 33*d*, a second reflector busbar 33*e*, and a plurality of reflector electrode fingers 33*f*.

A direction in which the reflector electrode fingers of each reflector extend is parallel or substantially parallel to the electrode finger extending direction. In the present example embodiment, the number of the reflector electrode fingers of each reflector is, for example, more than or equal to eight. Each reflector in acoustic devices according to example embodiments of the present invention only needs to include at least one reflector electrode finger.

Each electrode finger of the functional electrode 11 and each reflector electrode finger of each reflector include, for example, a multilayer metal film. Specifically, in each electrode finger and each reflector electrode finger, for example, a Ti layer, an AlCu layer, and a Ti layer are laminated in this order from the piezoelectric layer 14 side. The material of each electrode finger and each reflector electrode finger is not limited to the above. Alternatively, each electrode finger and each reflector electrode finger may include a single layer of metal film.

The potential to which the reflector 33A and the reflector 33B are connected is not particularly limited. For example, each reflector may be connected to the reference potential. Each reflector may be connected to the input potential or the output potential. Alternatively, each reflector may be a floating electrode. The floating electrode is an electrode that is not connected to any of the input potential, output potential, and reference potential.

In the present example embodiment, a filter waveform can be obtained even with a single acoustic wave device 10. Therefore, when the acoustic wave device 10 is used as an acoustic wave resonator in a filter device, a filter waveform can be suitably obtained even with one or a small number of acoustic wave resonators that constitute the filter device. This makes it possible to achieve miniaturization of the filter device.

An example of bandpass characteristics of the acoustic wave device 10 will be described below. Design parameters of the acoustic wave device 10 are as follows.

Piezoelectric layer

Material: $LiNbO_3$

Euler angles (φ, θ, ψ): (0°, 0°, 90°)

Thickness: about 400 nm

First to third electrode fingers

Layer structure: Ti layer/AlCu layer/Ti layer from the piezoelectric layer side

Thickness of each layer: about 10 nm/about 390 nm/about 4 nm from the piezoelectric layer side Order of the first to third electrode fingers expressed by the potential to be connected: IN, GND, OUT, and GND are repeated in this order.

Center-to-center distance p1 between adjacent electrode fingers: about 1.4 μm Duty ratio of functional electrode: about 0.3

Intersection width Ap: about 40 μm

Total number of first to third electrode fingers: 81

Number of reflector electrode fingers of each reflector: 8

Figure 4:
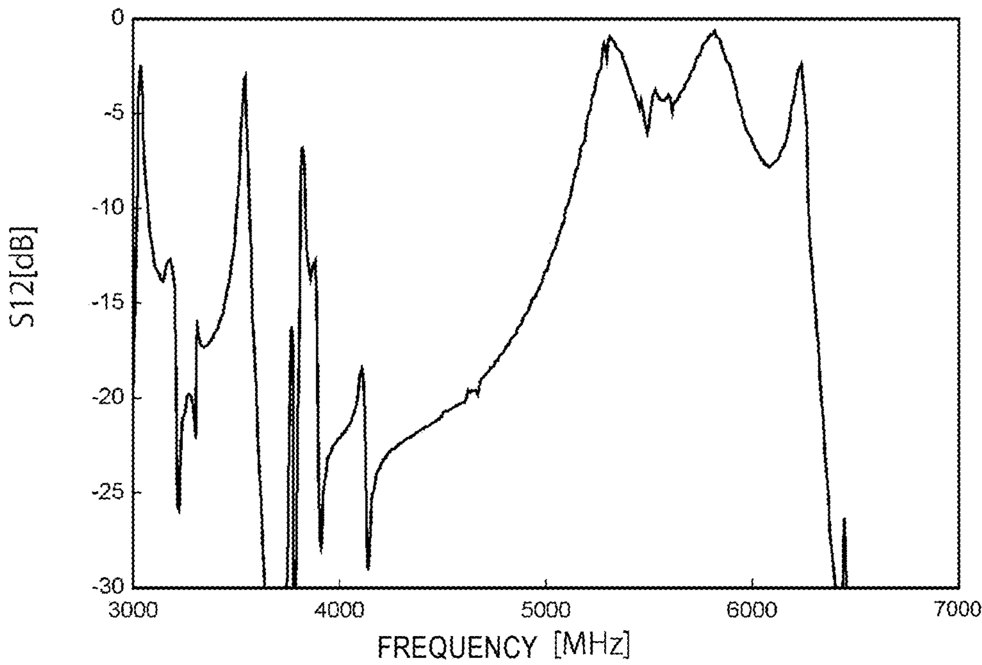
FIG. 4 is a graph illustrating bandpass characteristics of the acoustic wave device according to the first example embodiment of the present invention.

FIG. 4 is a graph illustrating bandpass characteristics of the acoustic wave device according to the first example embodiment.

As illustrated in FIG. 4, it can be seen that a filter waveform can be suitably obtained even with a single acoustic wave device 10. The acoustic wave device 10 is, for example, an acoustically coupled filter. More specifically, as illustrated in FIG. 2, the acoustic wave device 10 includes an excitation region C located between the centers of the adjacent first electrode finger 25 and third electrode finger 27, and an excitation region C located between the centers of the adjacent second electrode finger 26 and third electrode finger 27. In these excitation regions C, acoustic waves in a plurality of modes including a thickness-shear mode bulk wave are excited. By coupling these modes, a filter waveform can be suitably obtained even with a single acoustic wave device 10.

In the present example embodiment, the insertion loss can also be reduced. This will be described below by comparing the present example embodiment with a comparative example.

The comparative example differs from the first example embodiment in that it includes no reflector. The bandpass characteristics of the first example embodiment and the comparative example are compared. The design parameters of the acoustic wave device 10 according to the first example embodiment for comparison are the same or substantially the same as those in the example illustrated in FIG. 4. The design parameters of the acoustic wave device according to the comparative example are also the same or substantially the same as those in the example illustrated in FIG. 4, except that no reflector is provided in the comparative example.

Figure 5:
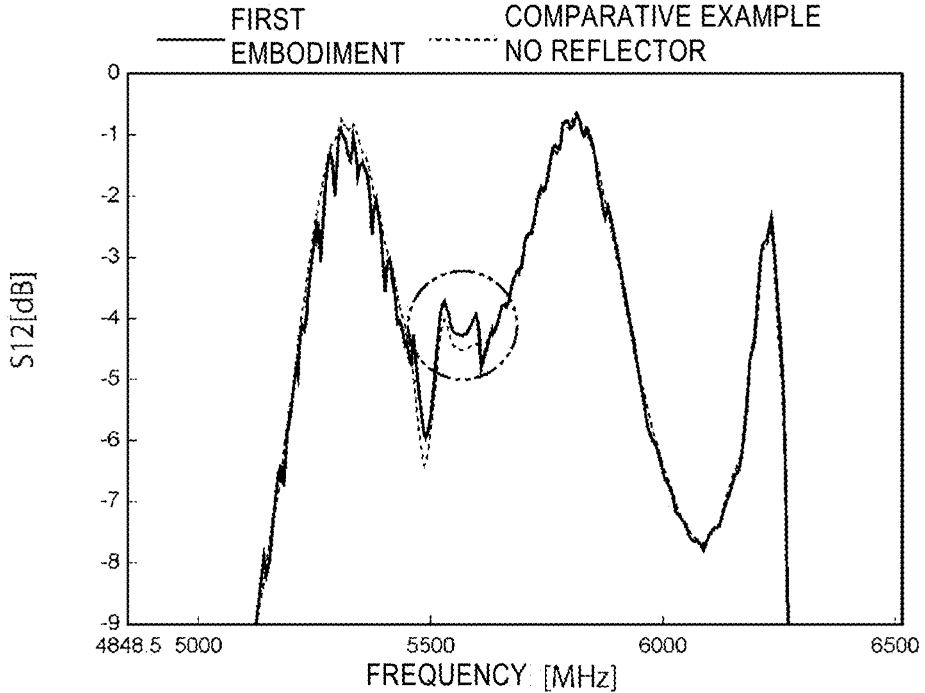
FIG. 5 is a graph illustrating bandpass characteristics in the first example embodiment of the present invention and a comparative example.

FIG. 5 is a graph illustrating bandpass characteristics in the first example embodiment and the comparative example.

The band surrounded by the two-dot chain line in FIG. 5 is the band near the center of the pass band. It can be seen that the insertion loss near the center of the pass band is smaller in the first example embodiment than in the comparative example. This is because the acoustic wave device 10 according to the first example embodiment illustrated in FIG. 2 includes the reflectors 33A and 33B.

Furthermore, the insertion loss near the center of the pass band is measured each time the number of reflector electrode fingers in each reflector is changed. Specifically, the number of reflector electrode fingers in each reflector is changed in increments of two within the range of 0 to 30. The design parameters other than those of the reflectors are the same or substantially the same as those in the example illustrated in FIG. 5.

Figure 6:
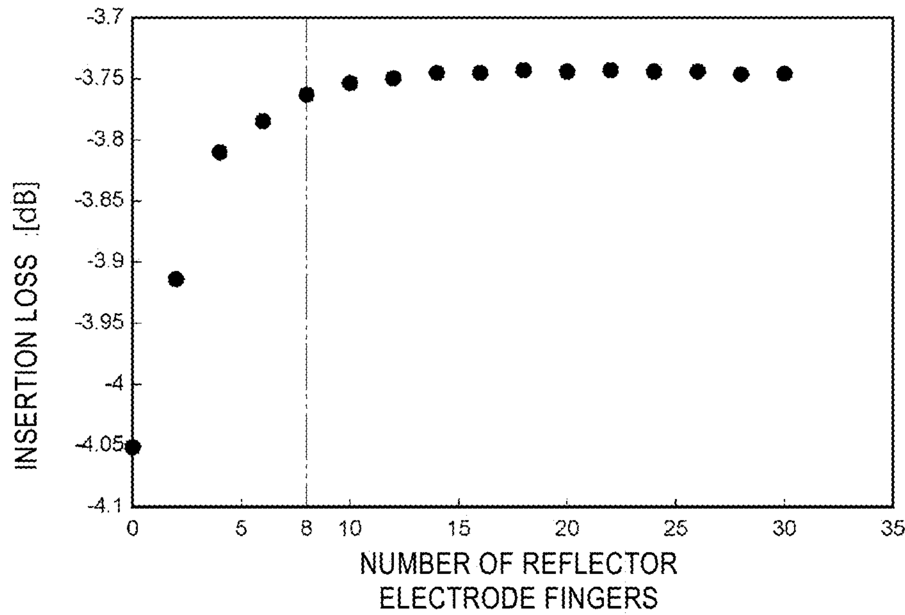
FIG. 6 is a graph illustrating the relationship between the number of reflector electrode fingers of each reflector and insertion loss near the center of a pass band.

FIG. 6 is a graph illustrating the relationship between the number of reflector electrode fingers of each reflector and the insertion loss near the center of the pass band.

As can be seen from FIG. 6, for example, when the number of reflector electrode fingers is less than or equal to eight, the more the number of reflector electrode fingers, the smaller the insertion loss. It can also be seen that, when the number of reflector electrode fingers is more than or equal to eight, the insertion loss can be effectively reduced. It is therefore preferable that each reflector has, for example, more than or equal to eight reflector electrode fingers.

The configuration of the first example embodiment will be described in more detail below.

As illustrated in FIG. 1, the support 13 includes the support substrate 16 and the insulating layer 15. The piezoelectric substrate 12 is a multilayer body of the support substrate 16, the insulating layer 15, and the piezoelectric layer 14. Specifically, the piezoelectric layer 14 and the support 13 overlap when viewed from the direction in which the first main surface 14*a* and the second main surface 14*b* of the piezoelectric layer 14 face each other.

Examples of the material of the support substrate 16 include a semiconductor such as silicon, ceramics such as aluminum oxide, and the like. The insulating layer 15 can be made of, for example, an appropriate dielectric such as silicon oxide or tantalum oxide. The piezoelectric layer 14 may be, for example, a lithium niobate layer such as a $LiNbO_3$ layer.

The insulating layer 15 includes a recess portion. The piezoelectric layer 14 is provided on the insulating layer 15 so as to close the recess portion. A hollow portion is thus provided. This hollow portion is a cavity 10*a*. In the first example embodiment, the support 13 and the piezoelectric layer 14 are disposed so that a portion of the support 13 and a portion of the piezoelectric layer 14 face each other across the cavity 10*a*. However, the recess portion in the support 13 may be provided across the insulating layer 15 and the support substrate 16. Alternatively, a recess portion provided only in the support substrate 16 may be closed by the insulating layer 15. The recess portion may be provided in the piezoelectric layer 14. The cavity 10*a* may be a through-hole provided in the support 13.

The cavity 10*a* is an acoustic reflection portion. The acoustic reflection portion can effectively confine the energy of the acoustic wave to the piezoelectric layer 14 side. The acoustic reflection portion may be provided at a position on the support 13 that overlaps at least a portion of the functional electrode 11 in plan view. More specifically, the first electrode finger 25, the second electrode finger 26, and the third electrode finger 27 may each at least partially overlap with the acoustic reflection portion in plan view. In plan view, a plurality of excitation regions C preferably overlap with the acoustic reflection portion.

In this specification, a plan view refers to a view along the lamination direction of the support 13 and the piezoelectric layer 14 from a direction corresponding to the upper side in FIG. 1. In FIG. 1, for example, of the support substrate 16 side and the piezoelectric layer 14 side, the piezoelectric layer 14 side is the upper side. Furthermore, in this specification, the plan view is synonymous with a view from a main surface facing direction. The main surface facing direction is a direction in which the first main surface 14*a* and the second main surface 14*b* of the piezoelectric layer 14 face each other. More specifically, the main surface facing direction is, for example, a normal direction of the first main surface 14*a*.

The acoustic reflection portion may be an acoustic reflection film such as an acoustic multilayer film, which will be described later. For example, the acoustic reflection film may be provided on the surface of the support.

In the functional electrode 11 illustrated in FIG. 2, the center-to-center distance p1 between adjacent electrode fingers is constant or substantially constant. However, the center-to-center distance p1 between the adjacent first electrode finger 25 and third electrode finger 27 and the center-to-center distance p1 between the adjacent second electrode finger 26 and third electrode finger 27 do not have to be constant or substantially constant. In this case, p is the longest distance of the center-to-center distance p1 between the adjacent first electrode finger 25 and third electrode finger 27 and the center-to-center distance p1 between the adjacent second electrode finger 26 and third electrode finger 27. In this case, for example, d/p is preferably less than or equal to about 0.5, more preferably less than or equal to about 0.24, where d is the thickness of the piezoelectric layer 14. This allows for better excitation of the thickness-shear mode bulk wave.

On the other hand, when the center-to-center distance p1 is constant as in the first example embodiment, p1=p for any center-to-center distance p1 between adjacent electrode fingers. In this case, again, for example, d/p is preferably less than or equal to about 0.5, more preferably less than or equal to about 0.24. The acoustic wave device does not necessarily have to be configured to be able to use the thickness-shear mode.

An acoustic wave device according to an example embodiment of the present invention may be configured to be able to use a plate wave. In this case, the excitation region is the intersection region E illustrated in FIG. 2. In example embodiments of the present invention, a pair of reflectors are provided. This makes it possible to suitably improve the resonance characteristics also in the case of using the plate wave.

In the first example embodiment, the piezoelectric layer 14 is, for example, a $LiNbO_3$ layer. In this case, the fractional band width of the acoustic wave device 10 depends on the Euler angles (φ, θ, ψ) of the lithium niobate used in the piezoelectric layer 14. The fractional band width is expressed by $(|fa-fr|/fr)\times 100$ [%], where fr is the resonant frequency and fa is the anti-resonant frequency.

The relationship between the fractional band width of the acoustic wave device 10 and the Euler angles (φ, θ, ψ) of the piezoelectric layer 14 when d/p is infinitely close to 0 is derived. Note that φ in the Euler angles is set to 0°.

Figure 7:
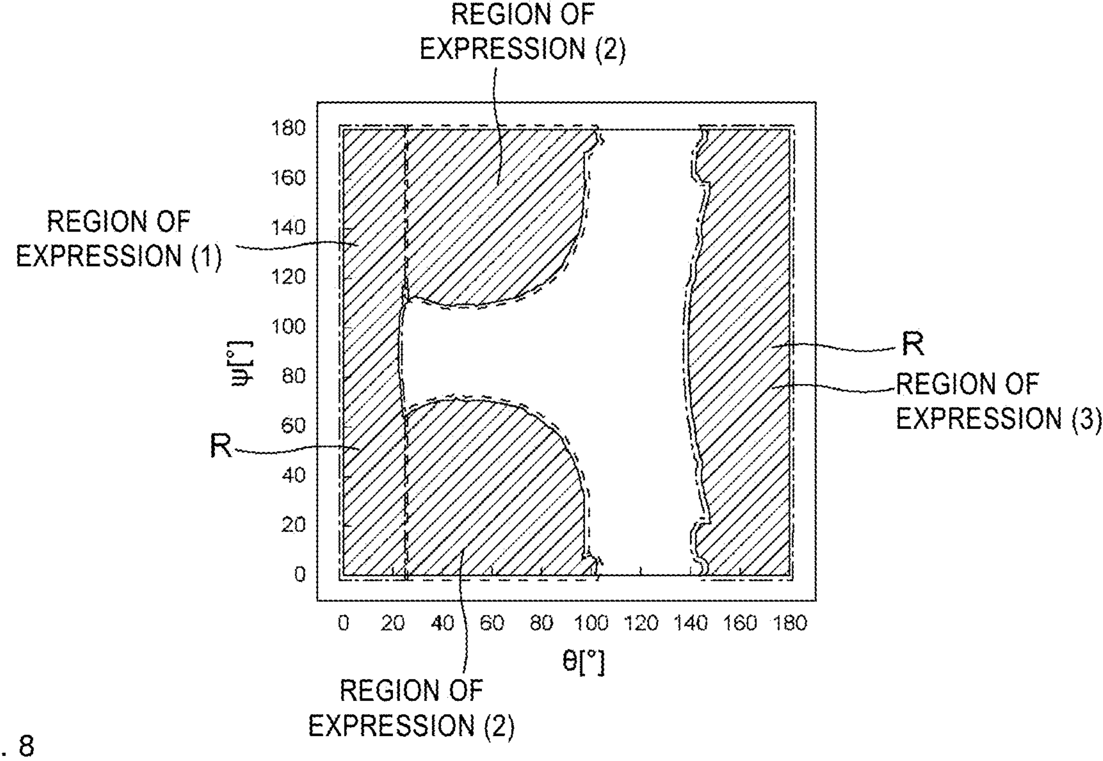
FIG. 7 is a diagram illustrating a map of a fractional band width with respect to Euler angles (0°, θ, ψ) of $LiNbO_3$ when d/p is infinitely close to 0.

FIG. 7 is a diagram illustrating a map of a fractional band width with respect to the Euler angles (0°, θ, ψ) of $LiNbO_3$ when d/p is infinitely close to 0.

A hatched region R in FIG. 7 is a region where the fractional band width of at least more than or equal to about 2% is obtained. When φ in the Euler angles (φ, θ, ψ) is within the range of about 0°±10°, the relationship between θ and ψ and the fractional band width is the same or substantially the same as that illustrated in FIG. 9. Also in the case where the piezoelectric layer 14 is a lithium tantalate layer, when φ is within the range of about 0°±10°, the relationship between θ and ψ and the fractional band width is the same as that illustrated in FIG. 9. The range of the region R is approximated by the following Expressions (1), (2), and (3).

(within the range of 0°±100, 0° to 25°, any ψ) Expression (1)

(within the range of 0°±10°, 25° to 100°, $75°[(1-(\theta-50)^2/2500)]^{1/2}$ or $180°-75°[(1-(\theta-50)^2/2500)]^{1/2}$ to 180°) Expression (2)

(within the range of 0°±10°, $180°-40°[(1-(\psi-90)^2/8100)]^{1/2}$ to 180°, any ψ) Expression (3)

It is preferable that the Euler angles are within the range of Expression (1), Expression (2), or Expression (3). This allows the fractional band width to be sufficiently widened, thus making it possible to suitably use the acoustic wave device 10 in a filter device.

Figure 8:
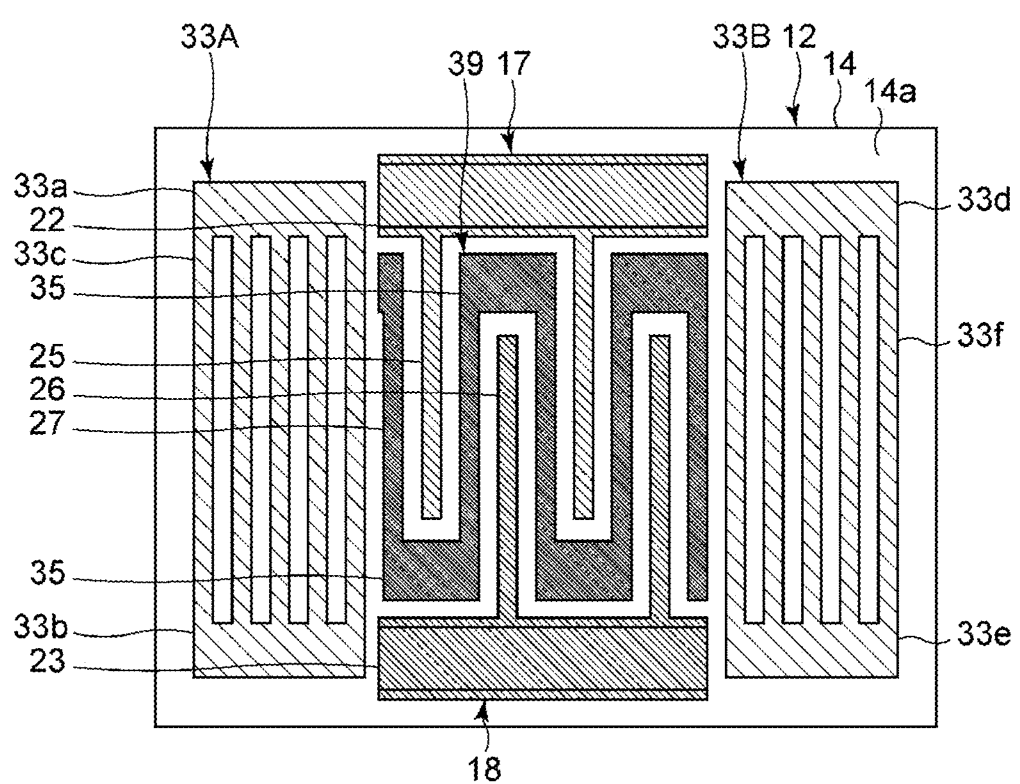
FIG. 8 is a schematic plan view of an acoustic wave device according to a modification of the first example embodiment of the present invention.

As illustrated in FIG. 2, in the first example embodiment, the reference potential electrode 19 includes the third busbar 24 as a connection electrode and the plurality of third electrode fingers 27. The reference potential electrode 19 is a comb-shaped electrode. However, the reference potential electrode 19 does not have to be a comb-shaped electrode. For example, in a modification of the first example embodiment illustrated in FIG. 8, the reference potential electrode 39 has a meandering shape. In this modification, the insulating film 29 is not provided on the piezoelectric layer 14. The connection electrode 35 includes only a portion corresponding to the plurality of first connection electrodes 24A in the first example embodiment. The connection electrode 35 in the present modification is not a third busbar.

More specifically, the reference potential electrode 39 includes a plurality of connection electrodes 35 located on the first busbar 22 side and a plurality of connection electrodes 35 located on the second busbar 23 side. The leading end portions of two adjacent third electrode fingers 27 on the first busbar 22 side or the leading end portions of two adjacent third electrode fingers 27 on the second busbar 23 side are connected to each other by the connection electrode 35. For example, among the plurality of third electrode fingers 27, the third electrode fingers 27 other than those at both ends in the electrode finger orthogonal direction have one connection electrode 35 connected to each of the leading end portions on the first busbar 22 side and the leading end portions on the second busbar 23 side. Each third electrode finger 27 is connected to its neighboring third electrode fingers 27 by each connection electrode 35. By repeating this structure, the reference potential electrode 39 is provided with a meandering shape.

In the present modification, the plurality of electrode fingers are arranged as follows. Specifically, starting from the first electrode finger 25, one period includes the first electrode finger 25, the third electrode finger 27, the second electrode finger 26, and the third electrode finger 27. The acoustic wave device includes a pair of reflectors 33A and 33B. As in the first example embodiment, this makes it possible to achieve the miniaturization of the filter device and to reduce the insertion loss.

Referring back to FIG. 2, in the following description, p2 is the center-to-center distance between the electrode finger located at the outermost side portion in the electrode finger orthogonal direction and the reflector electrode finger located at the innermost side portion in the electrode finger orthogonal direction, among the first electrode finger 25, the second electrode finger 26, and the third electrode finger 27. p3 is the center-to-center distance between adjacent reflector electrode fingers. In the first example embodiment, p1=p2=p3. However, the present invention is not limited thereto. Examples of cases where p1≠p2 and where p1≠p3 will be described below in second and third example embodiments.

The basic configuration of acoustic wave devices according to second and third example embodiments of the present invention are the same or substantially the same as that of the first example embodiment. Therefore, in the description of the second and third example embodiments, the drawings and reference numerals used in the description of the first example embodiment will be used. Note that, as in the first example embodiment, the second and third example embodiments also include a pair of reflectors. This makes it possible, when the acoustic wave device is used in a filter device, to achieve the miniaturization of the filter device and to reduce the insertion loss.

In the second example embodiment, p1≠p2. In the second example embodiment, the center-to-center distance p1 between adjacent electrode fingers in the functional electrode 11 is constant or substantially constant.

The bandpass characteristics are compared between the second example embodiment and a comparative example. An acoustic wave device of the comparative example differs from the second example embodiment in that it includes no reflector. Therefore, the acoustic wave device of the comparative example does not have such parameters as the center-to-center distance p2 illustrated in FIG. 2 and the center-to-center distance p3 between adjacent reflector electrode fingers. The bandpass characteristics are compared both when the center-to-center distance p1 and the center-to-center distance p2 in the second example embodiment are set to p1>p2 and when they are set to p1<p2. The design parameters of the acoustic wave device having the configuration of the second example embodiment are as follows.

Piezoelectric layer

Material: $LiNbO_3$

Euler angles (φ, θ, ψ): (0°, 0°, 90°)

Thickness: about 400 nm

First to third electrode fingers

Layer structure: Ti layer/AlCu layer/Ti layer from the piezoelectric layer side

Thickness of each layer: about 10 nm/about 390 nm/about 4 nm from the piezoelectric layer side Order of the first to third electrode fingers expressed by the potential to be connected: IN, GND, OUT, and GND are repeated in this order.

Center-to-center distance p1 between adjacent electrode fingers: about 1.4 μm Duty ratio of functional electrode: about 0.3

Number of reflector electrode fingers of each reflector: 8

The results of the first example embodiment where p1=p2 are also shown. The design parameters of the acoustic wave devices of the first example embodiment and the comparative example are the same or substantially the same as those in the comparison illustrated in FIG. 5.

Figure 9:
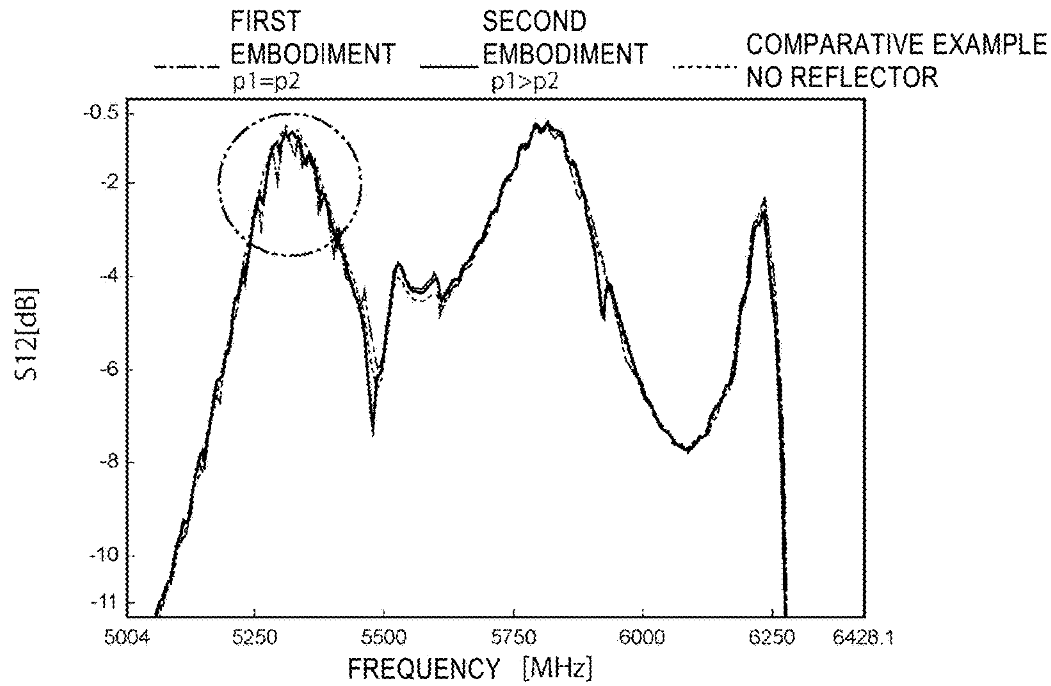
FIG. 9 is a graph illustrating bandpass characteristics of the first example embodiment of the present invention where p1=p2, a second example embodiment of the present invention where p1>p2, and a comparative example.
Figure 10:
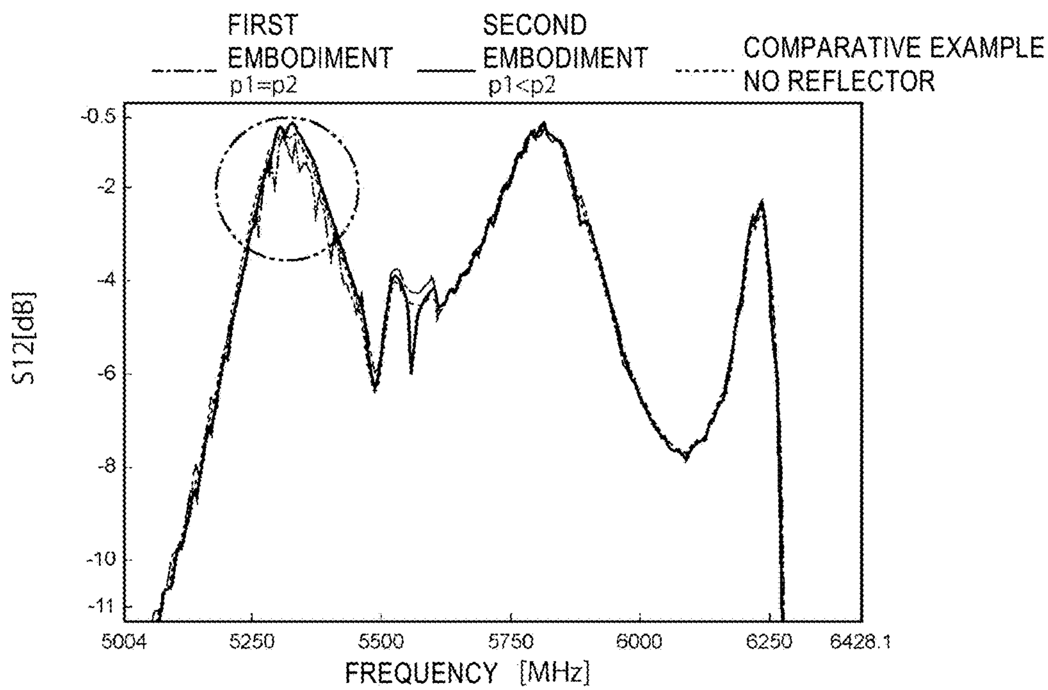
FIG. 10 is a graph illustrating bandpass characteristics of the first example embodiment of the present invention where p1=p2, the second example embodiment of the present invention where p1<p2, and the comparative example.

FIG. 9 is a graph illustrating bandpass characteristics of the first example embodiment where p1=p2, the second example embodiment where p1>p2, and the comparative example. FIG. 10 is a graph illustrating bandpass characteristics of the first example embodiment where p1=p2, the second example embodiment where p1<p2, and the comparative example.

The band surrounded by the two-dot chain line in FIG. 9 is the band on the low-pass side of the pass band. In the second example embodiment, the ripple is smaller on the low-pass side of the pass band than in the first example embodiment. This is because the second example embodiment includes the reflectors 33A and 33B illustrated in FIG. 2 and p1>p2. In addition, in the second example embodiment, as in the first example embodiment, the insertion loss is smaller near the center of the pass band than in the comparative example. The insertion loss can thus be reduced also when p1>p2, as in the case where p1=p2.

As illustrated in FIG. 10, when p1<p2, the peak loss is smaller than that of the comparative example on the low-pass side of the pass band.

The mode position can be finely adjusted by adjusting the center-to-center distance p2 between the electrode finger located at the outermost side portion in the electrode finger orthogonal direction and the reflector electrode finger located at the innermost side portion in the electrode finger orthogonal direction. This makes it possible to obtain the above-described respective advantageous effects when p1>p2 or p1<p2.

In the third example embodiment, the center-to-center distance p1 between adjacent electrode fingers and the center-to-center distance p3 between adjacent reflector electrode fingers are different from each other. In the third example embodiment, the center-to-center distance p1 is constant or substantially constant.

The bandpass characteristics are compared between the third example embodiment and a comparative example. An acoustic wave device of the comparative example differs from the third example embodiment in that it includes no reflector. Therefore, the acoustic wave device of the comparative example does not have such parameters as the center-to-center distance p2 and the center-to-center distance p3 illustrated in FIG. 2. The bandpass characteristics are compared both when the center-to-center distance p1 and the center-to-center distance p3 in the third example embodiment are set to p1>p3 and when they are set to p1<p3. The results of the first example embodiment where p1=p3 are also shown. The design parameters of the acoustic wave devices of the first example embodiment, the third example embodiment, and the comparative example are the same or substantially the same as those in the comparison illustrated in FIGS. 9 and 10.

Figure 11:
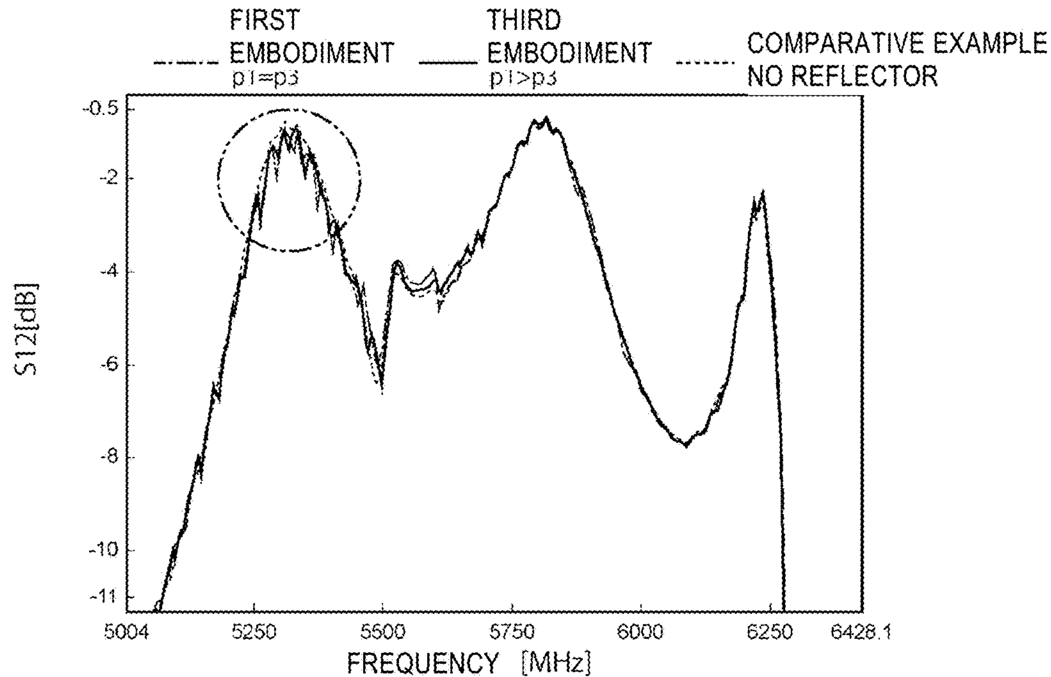
FIG. 11 is a graph illustrating bandpass characteristics of the first example embodiment of the present invention where p1=p3, a third example embodiment of the present invention where p1>p3, and the comparative example.
Figure 12:
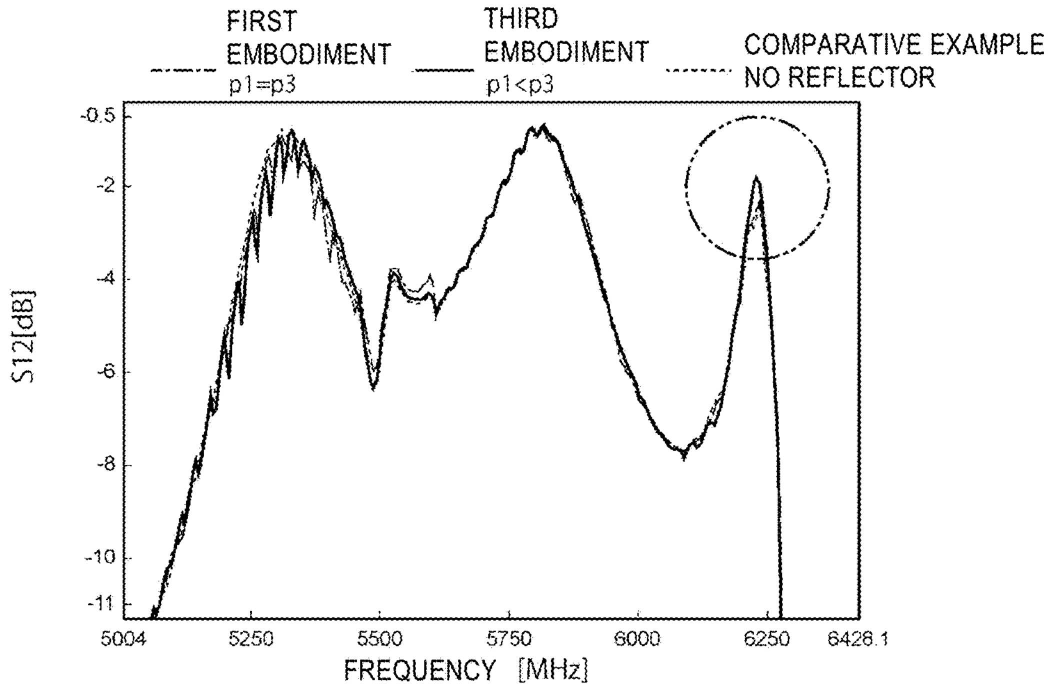
FIG. 12 is a graph illustrating bandpass characteristics of the first example embodiment of the present invention where p1=p3, the third example embodiment of the present invention where p1<p3, and the comparative example.

FIG. 11 is a graph illustrating bandpass characteristics of the first example embodiment where p1=p3, the third example embodiment where p1>p3, and the comparative example. FIG. 12 is a graph illustrating bandpass characteristics of the first example embodiment where p1=p3, the third example embodiment where p1<p3, and the comparative example.

The band surrounded by the two-dot chain line in FIG. 11 is the band on the low-pass side of the pass band. In the third example embodiment, the ripple is smaller on the low-pass side of the pass band than in the first example embodiment. This is because the third example embodiment includes the reflectors 33A and 33B illustrated in FIG. 2 and p1>p3. In addition, in the third example embodiment, as in the first example embodiment, the insertion loss is smaller near the center of the pass band than in the comparative example. The insertion loss can thus be reduced also when p1>p3, as in the case where p1=p3.

The band surrounded by the two-dot chain line in FIG. 12 is the band on the high-pass side of the pass band. When p1<p3, the insertion loss can be effectively reduced on the high-pass side of the pass band.

The mode position can be finely adjusted by adjusting the center-to-center distance p3 between adjacent reflector electrode fingers. This makes it possible to obtain the above-described respective advantageous effects when p1>p3 or p1<p3.

In the first to third example embodiments, w1=w2, where w1 is the width of the electrode fingers of the functional electrode 11 and w2 is the width of the reflector electrode fingers. The width w1 of the electrode fingers is the dimension along the electrode finger orthogonal direction of the electrode fingers. Similarly, the width w2 of the reflector electrode fingers is the dimension along the direction orthogonal or substantially orthogonal to the direction in which the reflector electrode fingers extend. However, w1≠w2 may also be the case. The present example will be described below in a fourth example embodiment of the present invention.

The basic configuration of an acoustic wave device of the fourth example embodiment is the same or substantially the same as that of the first example embodiment. Therefore, in the description of the fourth example embodiment, the drawings and reference numerals used in the description of the first example embodiment will be used. As in the first example embodiment, the fourth example embodiment also includes a pair of reflectors. This makes it possible, when the acoustic wave device is used in a filter device, to achieve the miniaturization of the filter device and to reduce the insertion loss.

In the fourth example embodiment, w1≠w2. The bandpass characteristics are compared between the fourth example embodiment and a comparative example. An acoustic wave device of the comparative example differs from the fourth example embodiment in including no reflector. Therefore, the acoustic wave device of the comparative example does not have the parameter of the width w2 of the reflector electrode fingers. The bandpass characteristics are compared both when the width w1 of the electrode fingers and the width w2 of the reflector electrode fingers in the fourth example embodiment is set to w1>w2 and when they are set to w1<w2. The design parameters of the acoustic wave device having the configuration of the fourth example embodiment are as follows.

Piezoelectric layer

Material: $LiNbO_3$

Euler angles (φ, θ, ψ): (0°, 0°, 90°)

Thickness: about 400 nm

First to third electrode fingers

Layer structure: Ti layer/AlCu layer/Ti layer from the piezoelectric layer side

Thickness of each layer: about 10 nm/about 390 nm/about 4 nm from the piezoelectric layer side Order of the first to third electrode fingers expressed by the potential to be connected: IN, GND, OUT, and GND are repeated in this order.

Center-to-center distance p1 between adjacent electrode fingers: about 1.4 μm Duty ratio of functional electrode: about 0.3

Number of reflector electrode fingers of each reflector: 8

The results of the first example embodiment where w1=w2 are also shown. The design parameters of the acoustic wave devices of the first example embodiment and the comparative example are the same or substantially the same as those in the comparison illustrated in FIG. 5.

Figure 13:
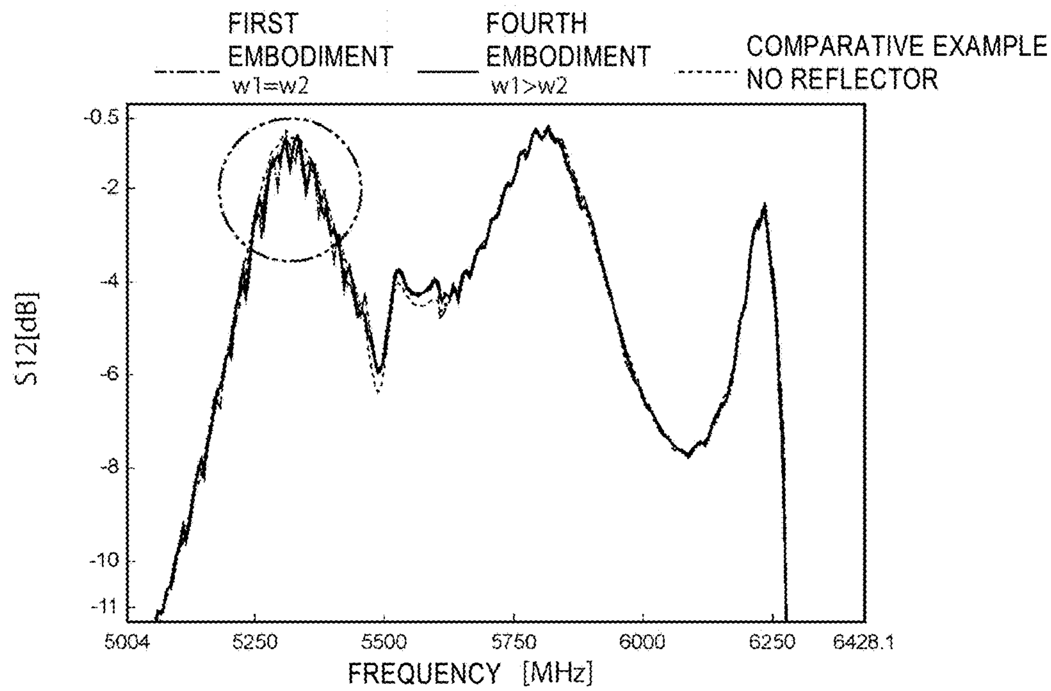
FIG. 13 is a graph illustrating bandpass characteristics of the first example embodiment of the present invention where w1=w2, a fourth example embodiment of the present invention where w1>w2, and the comparative example.
Figure 14:
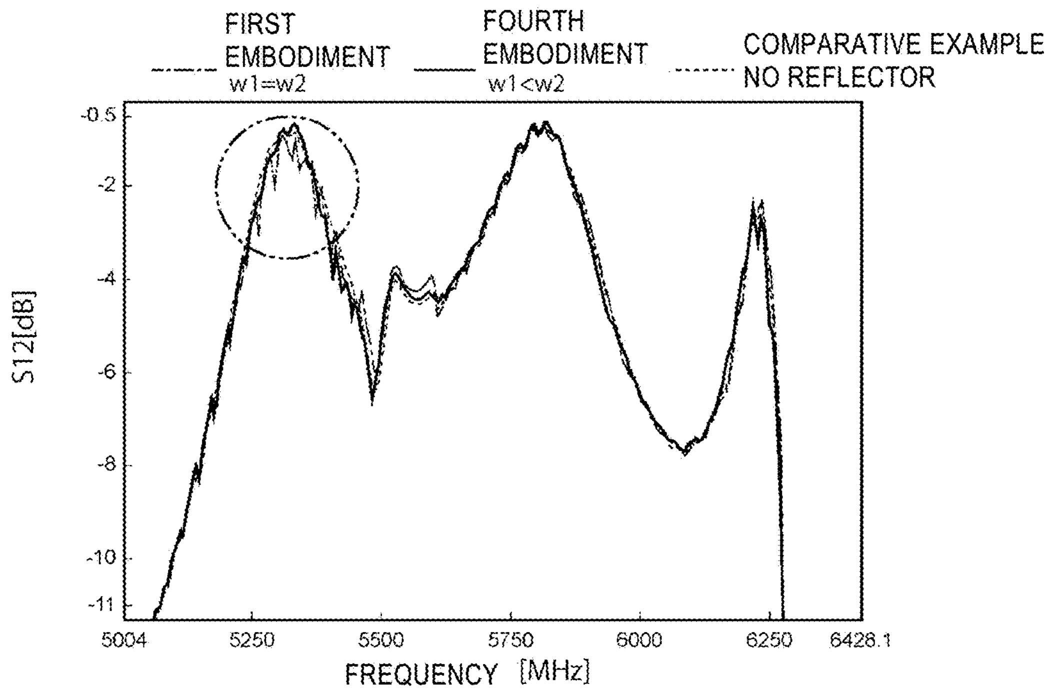
FIG. 14 is a graph illustrating bandpass characteristics of the first example embodiment of the present invention where w1=w2, the fourth example embodiment of the present invention where w1<w2, and the comparative example.

FIG. 13 is a graph illustrating bandpass characteristics of the first example embodiment where w1=w2, the fourth example embodiment where w1>w2, and the comparative example. FIG. 14 is a graph illustrating bandpass characteristics of the first example embodiment where w1=w2, the fourth example embodiment where w1<w2, and the comparative example.

The band surrounded by the two-dot chain line in FIG. 13 is the band on the low-pass side of the pass band. In the fourth example embodiment, the ripple is smaller on the low-pass side of the pass band than in the first example embodiment. This is because the fourth example embodiment includes the reflectors 33A and 33B illustrated in FIG. 2 and w1>w2. In addition, in the fourth example embodiment, as in the first example embodiment, the insertion loss is smaller near the center of the pass band than in the comparative example. The insertion loss can thus be reduced also when w1>w2, as in the case where w1=w2.

As illustrated in FIG. 14, when w1<w2, the peak loss is smaller than that of the comparative example on the low-pass side of the pass band.

In example embodiments of the present invention, a configuration may be provided that satisfies at least one of p1≠p2, p1≠p3, and w1≠w2 may be satisfied. For example, a configuration may be provided that satisfies more than one of p1≠p2, p1≠p3, and w1≠w2.

The thickness-shear mode will be described in detail below using an example where the functional electrode is an IDT electrode. The IDT electrode includes no third electrode fingers. The "electrode" in the IDT electrode described below corresponds to the electrode finger. A support in the following example corresponds to the support substrate. The reference potential may be hereinafter referred to as a ground potential.

Figure 15A:
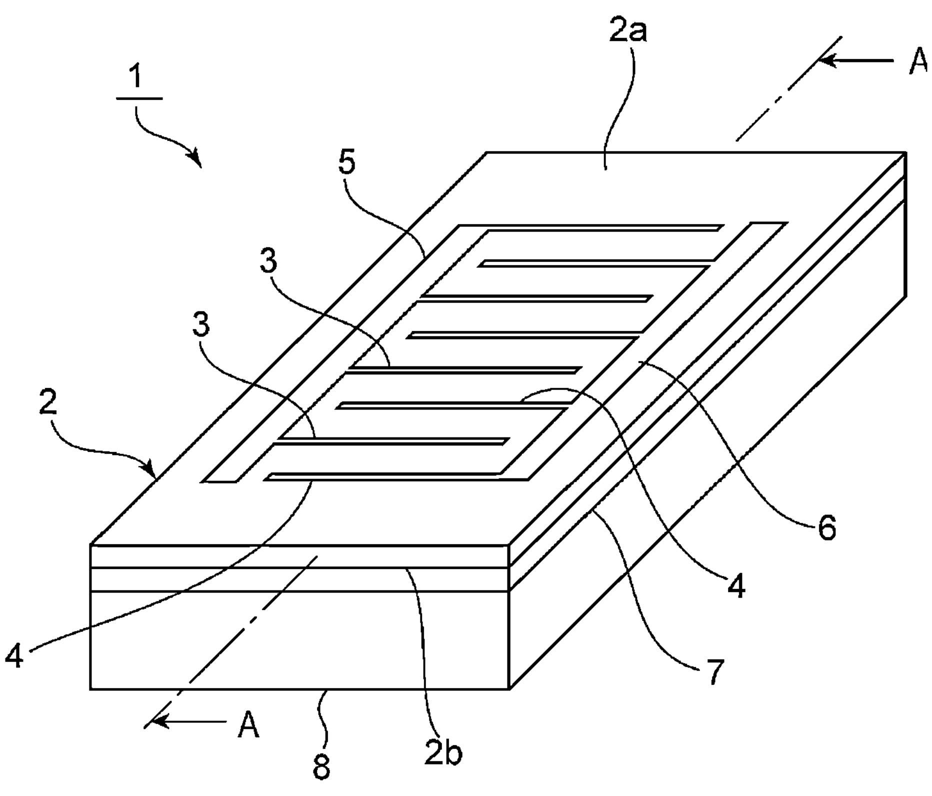
FIG. 15A is a schematic perspective view illustrating an appearance of an acoustic wave device that uses bulk waves in a thickness-shear mode.
Figure 15B:
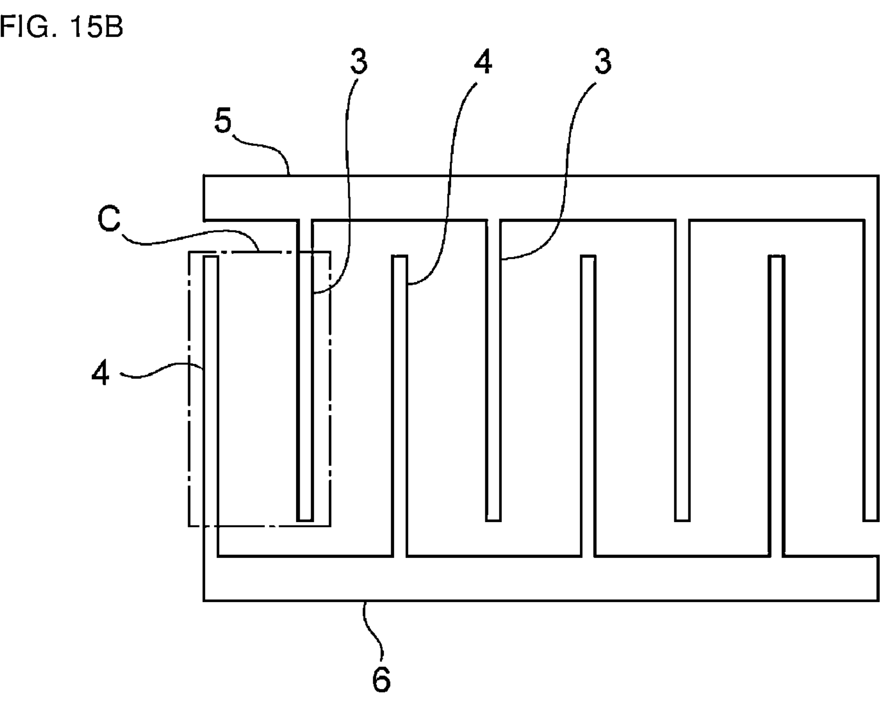
FIG. 15B is a plan view illustrating an electrode structure on a piezoelectric layer.
Figure 16:
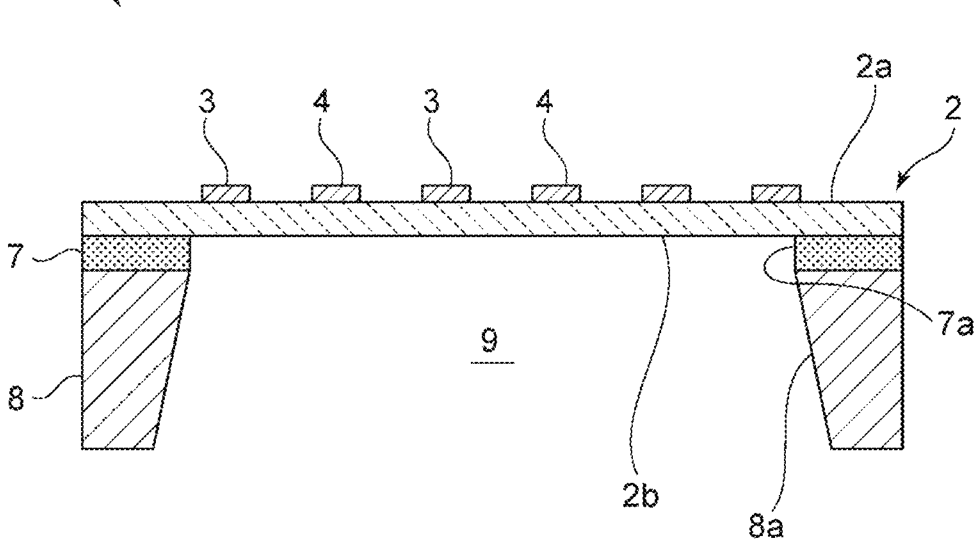
FIG. 16 is a cross-sectional view of a portion taken along line A-A in FIG. 15A.

FIG. 15A is a schematic perspective view illustrating an appearance of an acoustic wave device that uses a thickness-shear mode bulk wave. FIG. 15B is a plan view illustrating an electrode structure on a piezoelectric layer. FIG. 16 is a cross-sectional view of a portion taken along line A-A in FIG. 15A.

An acoustic wave device 1 includes a piezoelectric layer 2 made of, for example, $LiNbO_3$. The piezoelectric layer 2 may be made of, for example, $LiTaO_3$. The cut-angle of $LiNbO_3$ or $LiTaO_3$ is a Z-cut in the present example embodiment, but may be a rotated Y-cut or X-cut. The thickness of the piezoelectric layer 2 is not particularly limited, but is, for example, preferably more than or equal to about 40 nm and less than or equal to about 1000 nm, and more preferably more than or equal to about 50 nm and less than or equal to about 1000 nm in order to effectively excite a thickness-shear mode. The piezoelectric layer 2 includes a first main surface 2_a_ and a second main surface 2_b_ facing each other. An electrode 3 and an electrode 4 are provided on the first main surface 2_a_. Here, the electrode 3 is an example of a "first electrode" and the electrode 4 is an example of a "second electrode". In FIGS. 15A and 15B, a plurality of the electrodes 3 are connected to a first busbar 5. A plurality of the electrodes 4 are connected to a second busbar 6. The plurality of electrodes 3 and the plurality of electrodes 4 are interdigitated with each other. The electrode 3 and the electrode 4 have a rectangular or substantially rectangular shape and have a length direction. In a direction orthogonal or substantially orthogonal to the length direction, the electrode 3 and the electrode 4 adjacent thereto face each other. The length direction of the electrodes 3 and 4 and the direction orthogonal or substantially orthogonal to the length direction of the electrodes 3 and 4 each are a direction intersecting a thickness direction of the piezoelectric layer 2. Therefore, it can also be said that the electrode 3 and the electrode 4 adjacent thereto face each other in the direction intersecting the thickness direction of the piezoelectric layer 2. The length direction of the electrodes 3 and 4 may be replaced with the direction orthogonal or substantially orthogonal to the length direction of the electrodes 3 and 4 illustrated in FIGS. 15A and 15B. That is, the electrodes 3 and 4 may extend in the direction in which the first busbar 5 and the second busbar 6 extend in FIGS. 15A and 15B. In this case, the first busbar 5 and the second busbar 6 extend in the direction in which the electrodes 3 and 4 extend in FIGS. 15A and 15B. A plurality of pairs of structures in which the electrode 3 connected to one potential and the electrode 4 connected to the other potential are adjacent to each other are provided in the direction orthogonal or substantially orthogonal to the length direction of the electrodes 3 and 4 described above. Here, the electrode 3 and the electrode 4 being adjacent to each other refers not to a case where the electrode 3 and the electrode 4 are arranged so as to be in direct contact with each other, but to a case where the electrode 3 and the electrode 4 are arranged with an interval therebetween. When the electrode 3 and the electrode 4 are adjacent to each other, an electrode connected to a hot electrode or a ground electrode, including the other electrodes 3 and 4, is not arranged between the electrode 3 and the electrode 4. The number of pairs need not be integer pairs, but may be, for example, 1.5 pairs, 2.5 pairs, or the like. The center-to-center distance between the electrodes 3 and 4, that is, the pitch is, for example, preferably in the range of more than or equal to about 1 μm and less than or equal to about 10 μm. In addition, the width of the electrodes 3 and 4, that is, the dimension of the electrodes 3 and 4 in their facing direction, is, for example, preferably in the range of more than or equal to about 50 nm and less than or equal to about 1000 nm, and more preferably in the range of more than or equal to about 150 nm and less than or equal to about 1000 nm. The center-to-center distance between the electrodes 3 and 4 is a distance connecting the center of the dimension (width dimension) of the electrode 3 in the direction orthogonal or substantially orthogonal to the length direction of the electrode 3 and the center of the dimension (width dimension) of the electrode 4 in the direction orthogonal or substantially orthogonal to the length direction of the electrode 4.

In the acoustic wave device 1, since the Z-cut piezoelectric layer is used, the direction orthogonal for substantially orthogonal to the length direction of the electrodes 3 and 4 is a direction orthogonal or substantially orthogonal to the polarization direction of the piezoelectric layer 2. This does not apply when a piezoelectric body of another cut-angle is used as the piezoelectric layer 2. Here, the term "orthogonal" is not limited to strictly orthogonal but may be substantially orthogonal (an angle between the direction orthogonal to the length direction of the electrodes 3 and 4 and the polarization direction is, for example, about 90°±10°).

A support 8 is laminated on the second main surface 2_b_ side of the piezoelectric layer 2 with an insulating layer 7 interposed therebetween. The insulating layer 7 and the support 8 have a frame shape and include through-holes 7_a_ and 8_a_ as illustrated in FIG. 16. A cavity 9 is thus provided.

The cavity 9 is provided so as not to interfere with the vibration of an excitation region C of the piezoelectric layer 2. Therefore, the support 8 is laminated on the second main surface 2*b* with the insulating layer 7 interposed therebetween at a position not overlapping with a portion where at least a pair of electrodes 3 and 4 are provided. The insulating layer 7 need not be provided. Therefore, the support 8 can be directly or indirectly laminated on the second main surface 2*b* of the piezoelectric layer 2.

The insulating layer 7 is made of, for example, silicon oxide. However, the insulating layer 7 can be made of an appropriate insulating material such as, for example, silicon oxynitride or alumina in addition to silicon oxide. The support 8 is made of, for example, Si. The plane orientation of the surface of Si on the piezoelectric layer 2 side may be (100), (110), or (111). Preferably, for example, high-resistance Si having the support 8 of more than or equal to about 4 kΩ cm is used. However, the support 8 can also be made using an appropriate insulating material or semiconductor material.

Examples of the material of the support 8 include piezoelectric bodies such as aluminum oxide, lithium tantalate, lithium niobate, and quartz crystal, various ceramics such as alumina, magnesia, sapphire, silicon nitride, aluminum nitride, silicon carbide, zirconia, cordierite, mullite, steatite, and forsterite, dielectrics such as diamond and glass, semiconductors such as gallium nitride, and the like.

The plurality of electrodes 3 and 4 and the first and second busbars 5 and 6 are made of an appropriate metal or alloy such as, for example, Al or an AlCu alloy. In the acoustic wave device 1, for example, the electrodes 3 and 4 and the first and second busbars 5 and 6 have a structure in which an Al film is laminated on a Ti film. A close contact layer other than the Ti film may be used.

At the time of driving, an AC voltage is applied between the plurality of electrodes 3 and the plurality of electrodes 4. More specifically, an AC voltage is applied between the first busbar 5 and the second busbar 6. This makes it possible to obtain resonance characteristics using a bulk wave in the thickness-shear mode excited in the piezoelectric layer 2. In the acoustic wave device 1, for example, d/p is less than or equal to about 0.5, where d is the thickness of the piezoelectric layer 2, and p is the center-to-center distance between any adjacent electrodes 3 and 4 of the plurality of pairs of electrodes 3 and 4. Therefore, the bulk wave in the thickness-shear mode is effectively excited, and good resonance characteristics can be obtained. More preferably, for example, d/p is less than or equal to about 0.24, in which case even better resonance characteristics can be obtained.

Since the acoustic wave device 1 has the configuration described above, even when the number of pairs of the electrodes 3 and 4 is reduced in an attempt for miniaturization, Q value is not easily reduced. This is because the propagation loss is small even if the number of electrode fingers in the reflectors on both sides is reduced. In addition, the reason why the number of electrode fingers can be reduced is that the bulk wave in the thickness-shear mode is used. The difference between a Lamb wave used in an acoustic wave device and the thickness-shear mode bulk wave described above will be described with reference to FIGS. 17A and 17B.

Figure 17A:
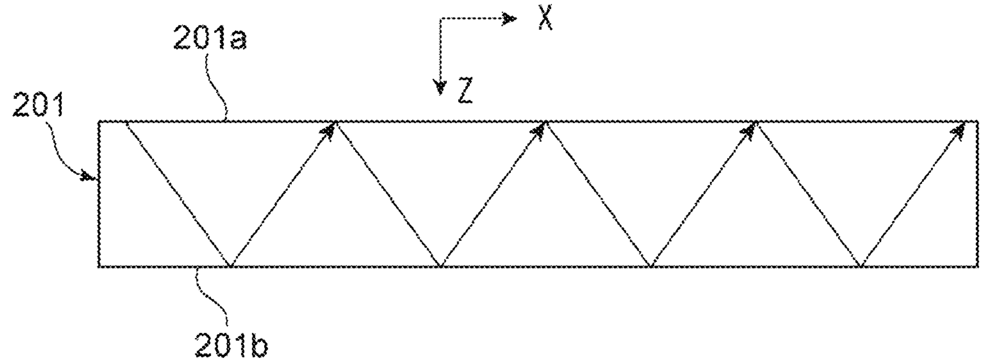
FIG. 17A is a schematic elevational cross-sectional view for explaining a Lamb wave propagating through a piezoelectric film of the acoustic wave device.

FIG. 17A is a schematic elevational cross-sectional view for explaining a Lamb wave propagating through a piezoelectric film of an acoustic wave device as described in Japanese Unexamined Patent Application Publication No. 2012-257019. As illustrated in FIG. 17A, a wave propagates through a piezoelectric film 201 as indicated by arrows. Here, the piezoelectric film 201 includes a first main surface 201*a* and a second main surface 201*b*, which face each other, and a thickness direction connecting the first main surface 201*a* and the second main surface 201*b* is the Z direction. The X direction is a direction in which electrode fingers of an IDT electrode are arranged. As illustrated in FIG. 17A, the Lamb wave propagates in the X direction. Although the piezoelectric film 201 vibrates as a whole because of the plate wave, since the wave propagates in the X direction, reflectors are arranged on both sides to obtain resonance characteristics. Therefore, a propagation loss of waves occurs, and the Q value decreases when the size is reduced, that is, when the number of pairs of electrode fingers is reduced.

Figure 17B:
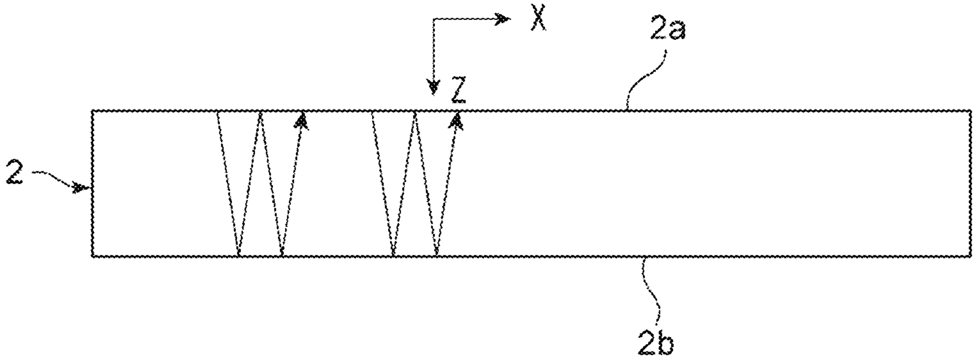
FIG. 17B is a schematic elevational cross-sectional view for explaining a bulk wave in the thickness-shear mode propagating through the piezoelectric film of the acoustic wave device.

On the other hand, as illustrated in FIG. 17B, in the acoustic wave device 1, since the vibration displacement is in the thickness-shear direction, the wave substantially propagates in the direction connecting the first main surface 2*a* and the second main surface 2*b* of the piezoelectric layer 2, that is, the Z direction, and resonates. Specifically, the X direction component of the wave is significantly smaller than the Z direction component. Since resonance characteristics are obtained by the propagation of the wave in the Z direction, propagation loss does not easily occur even when the number of electrode fingers of the reflector is reduced. Furthermore, even when the number of pairs of electrodes including the electrodes 3 and 4 is reduced in an attempt to achieve miniaturization, the Q value is not easily reduced.

Figure 18:
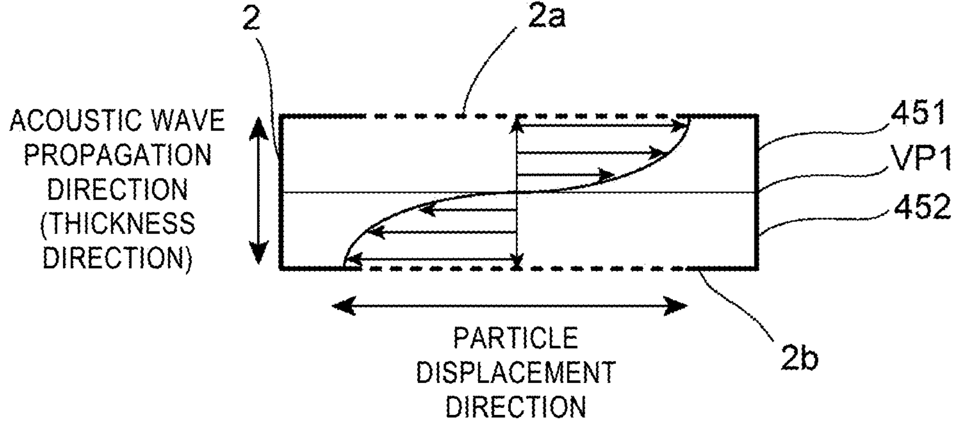
FIG. 18 is a diagram illustrating an amplitude direction of the thickness-shear mode bulk wave.

As illustrated in FIG. 18, the amplitude direction of the bulk wave in the thickness-shear mode in a first region 451 included in the excitation region C of the piezoelectric layer 2 is the opposite in a second region 452 included in the excitation region C. FIG. 18 schematically illustrates a bulk wave when a voltage is applied between the electrode 3 and the electrode 4 so that the electrode 4 has a higher potential than the electrode 3. The first region 451 is a region between the first main surface 2*a* and a virtual plane VP1 that is orthogonal or substantially orthogonal to the thickness direction of the piezoelectric layer 2 and divides the piezoelectric layer 2 into two portions in the excitation region C. The second region 452 is a region between the virtual plane VP1 and the second main surface 2*b* in the excitation region C.

As described above, in the acoustic wave device 1, at least a pair of electrodes including the electrode 3 and the electrode 4 is provided. However, since waves are not propagated in the X direction, the plurality of pairs of electrodes including the electrodes 3 and 4 are not always necessary. That is, only at least a pair of electrodes may be provided.

For example, the electrode 3 is an electrode connected to the hot potential, and the electrode 4 is an electrode connected to the ground potential. However, the electrode 3 may be connected to the ground potential and the electrode 4 may be connected to the hot potential. In the acoustic wave device 1, as described above, at least a pair of electrodes is the electrode connected to the hot potential or the electrode connected to the ground potential, and a floating electrode is not provided.

Figure 19:
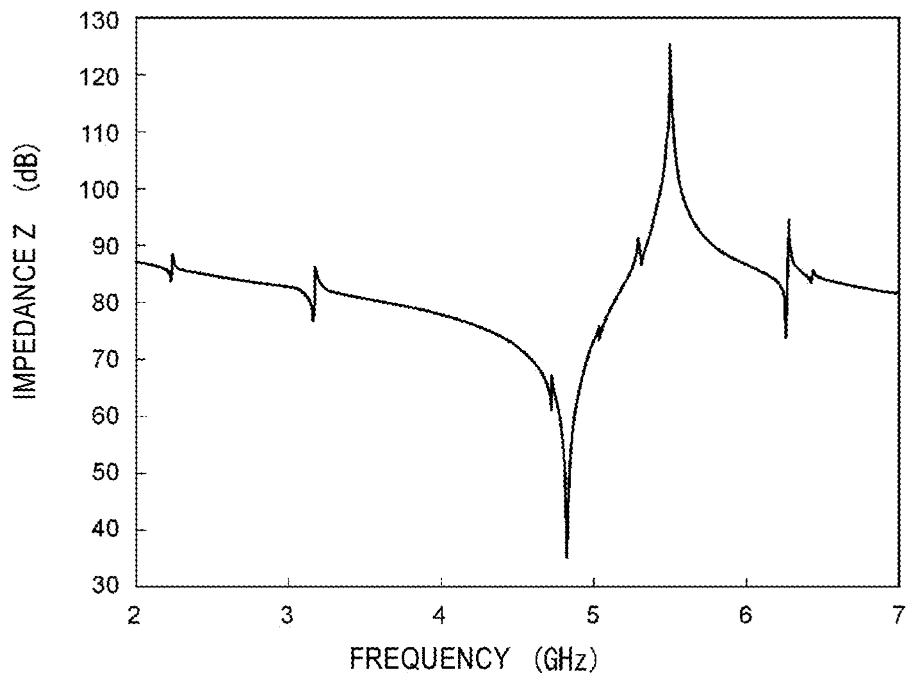
FIG. 19 is a graph illustrating resonance characteristics of the acoustic wave device using the thickness-shear mode bulk wave.

FIG. 19 is a graph illustrating resonance characteristics of the acoustic wave device illustrated in FIG. 16. The design parameters of the acoustic wave device 1 having the resonance characteristics are as follows.

Piezoelectric layer 2: $LiNbO_3$ with Euler angles (0°, 0°, 90°)

Thickness: about 400 nm

Length of region where electrodes 3 and 4 overlap as seen in direction orthogonal to length direction of electrodes 3 and 4, that is, excitation region C: about 40 μm Number of pairs of electrodes consisting of electrodes 3 and 4: 21 pairs Center-to-center distance between electrodes: about 3 μm Width of electrodes 3 and 4: about 500 nm d/p: about 0.133

Insulating layer 7: silicon oxide film with thickness of about 1 μm

Support 8: Si

The length of the excitation region C is a dimension of the excitation region C along the length direction of the electrodes 3 and 4.

In the acoustic wave device 1, the electrode-to-electrode distances of the electrode pairs including the electrodes 3 and 4 are all equal or substantially equal in the plurality of pairs. That is, the electrodes 3 and the electrodes 4 are arranged with equal or substantially equal pitches.

As is clear from FIG. 19, good resonance characteristics with the fractional band width of about 12.5% are obtained even though no reflector is provided.

As described above, in the acoustic wave device 1, d/p is, for example, less than or equal to about 0.5, more preferably less than or equal to about 0.24, where d is the thickness of the piezoelectric layer 2 and p is the center-to-center distance between the electrode 3 and the electrode 4. This will be described with reference to FIG. 20.

Figure 20:
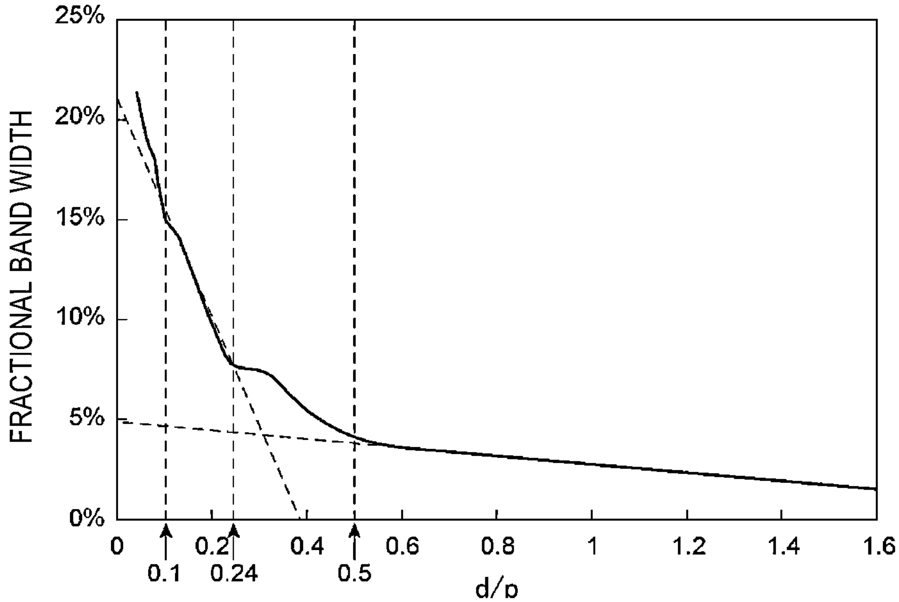
FIG. 20 is a graph illustrating a relationship between d/p and a fractional band width of a resonator, where p is the center-to-center distance between adjacent electrodes and d is the thickness of the piezoelectric layer.

A plurality of acoustic wave devices are obtained in the same or substantially the same manner as the acoustic wave device having the resonance characteristics illustrated in FIG. 19, except that d/p is changed. FIG. 20 is a graph illustrating a relationship between d/p and the fractional band width of the acoustic wave device as a resonator.

As is clear from FIG. 20, when d/p >about 0.5, the fractional band width is less than about 5% even if d/p is adjusted. On the other hand, when d/p ≤about 0.5, the fractional band width can be set to more than or equal to about 5% by changing d/p within that range, that is, a resonator with a high coupling coefficient can be configured. Furthermore, when d/p is less than or equal to about 0.24, the fractional band width can be increased to more than or equal to about 7%. In addition, by adjusting d/p within this range, a resonator with an even wider fractional band width can be obtained, and a resonator with an even higher coupling coefficient can be realized. Therefore, for example, it can be seen that, by setting d/p to less than or equal to about 0.5, a resonator with a high coupling coefficient can be configured using the thickness-shear mode bulk wave.

Figure 21:
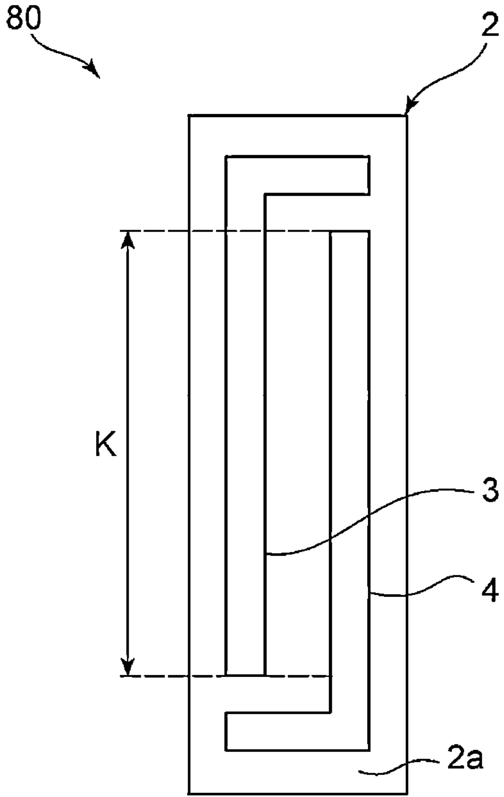
FIG. 21 is a plan view of the acoustic wave device using the thickness-shear mode bulk wave.

FIG. 21 is a plan view of an acoustic wave device that uses a thickness-shear mode bulk wave. In an acoustic wave device 80, a pair of electrodes, including an electrode 3 and an electrode 4, are provided on a first main surface 2*a* of a piezoelectric layer 2. Note that K in FIG. 21 is an intersection width. As described above, in the acoustic wave device of the present invention, the number of pairs of electrodes may be one. Even in this case, for example, when the d/p is less than or equal to about 0.5, the thickness-shear mode bulk wave can be effectively excited.

Figure 22:
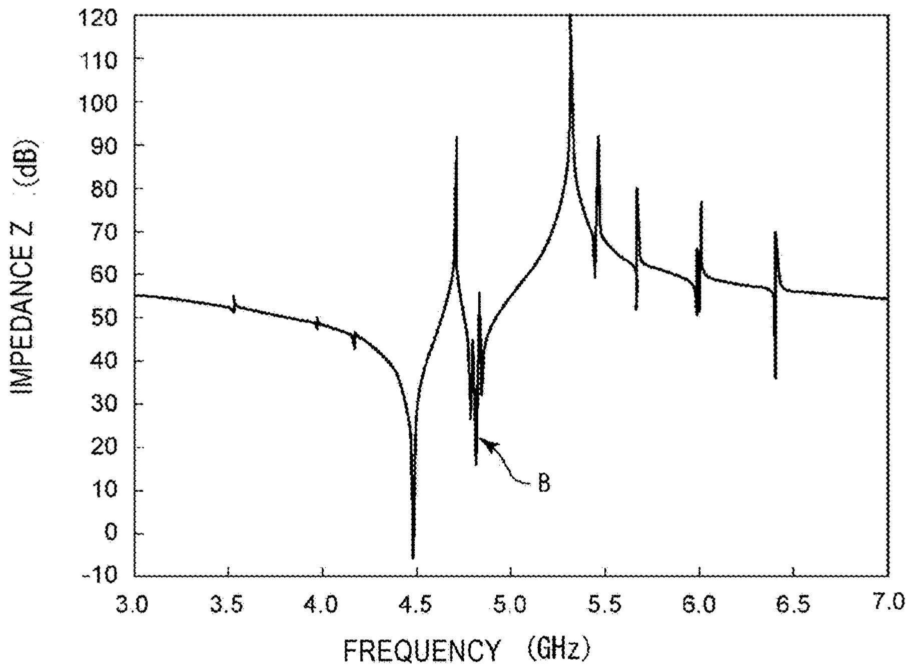
FIG. 22 is a diagram illustrating resonance characteristics of an acoustic wave device in a reference example where a spurious response appears.

In the acoustic wave device 1, for example, it is preferable that a metallization ratio MR of any adjacent electrodes 3 and 4 of the plurality of electrodes 3 and 4 with respect to the excitation region C, which is a region where the adjacent electrodes 3 and 4 overlap when viewed in their facing direction, satisfies MR ≤about 1.75 (d/p)+0.075. In that case, a spurious response can be effectively reduced. This will be described with reference to FIGS. 22 and 23. FIG. 22 is a reference diagram illustrating an example of the resonance characteristics of the acoustic wave device 1. A spurious response indicated by an arrow B appears between a resonant frequency and an anti-resonant frequency. d/p=about 0.08 and the Euler angles of $LiNbO_3$ are (0°, 0°, 90°). The metallization ratio MR is about 0.35.

The metallization ratio MR will be described with reference to FIG. 15B. In the electrode structure of FIG. 15B, when focusing on a pair of electrodes 3 and 4, it is assumed that only this pair of electrodes 3 and 4 is provided. In this case, a portion surrounded by a dashed-dotted line is the excitation region C. When the electrode 3 and the electrode 4 are viewed in the direction orthogonal or substantially orthogonal to the length direction of the electrodes 3 and 4, that is, in their facing direction, the excitation region C is a region of the electrode 3 that overlaps the electrode 4, a region of the electrode 4 that overlaps the electrode 3, and a region between the electrode 3 and the electrode 4 where the electrode 3 and the electrode 4 overlap each other. An area of the electrodes 3 and 4 in the excitation region C with respect to the area of the excitation region C is the metallization ratio MR. That is, the metallization ratio MR is the ratio of the area of the metallization portion to the area of the excitation region C.

When a plurality of pairs of electrodes are provided, the ratio of the metallization portion included in the entire excitation region to the total area of the excitation region may be MR.

Figure 23:
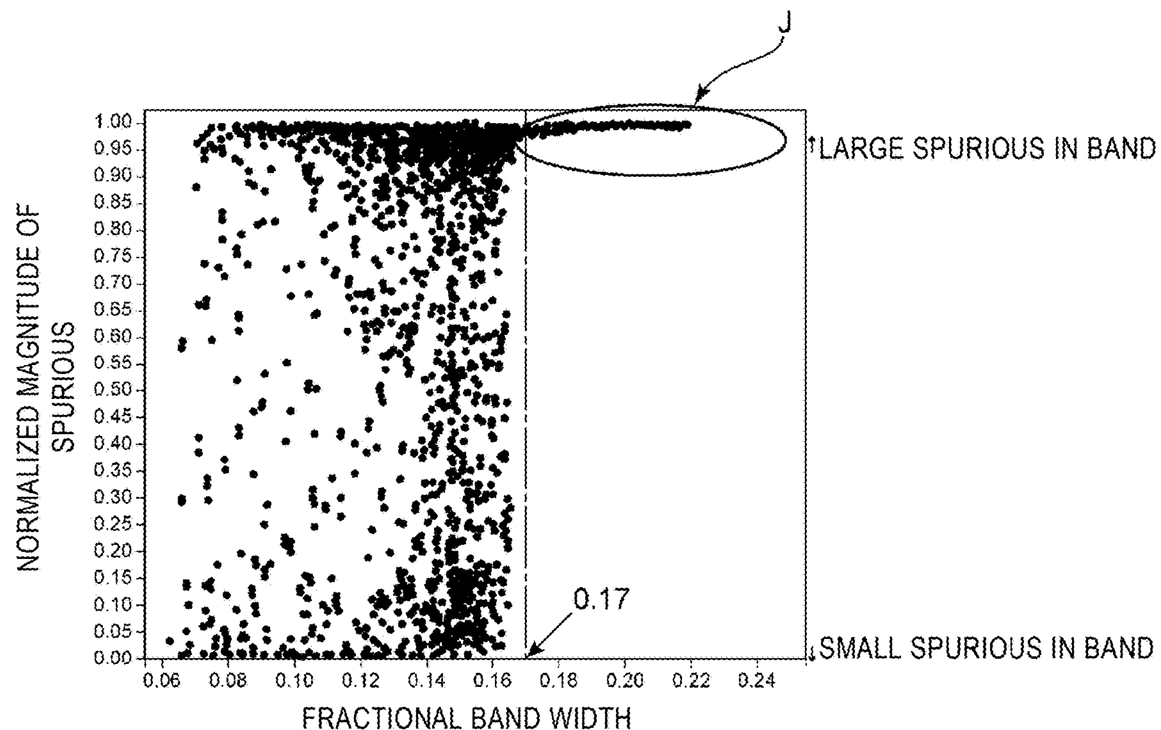
FIG. 23 is a diagram illustrating a relationship between a fractional band width and a phase rotation amount of a spurious impedance normalized by about 180 degrees as a magnitude of a spurious response.

FIG. 23 is a diagram illustrating a relationship between a fractional band width and a phase rotation amount of the spurious impedance normalized by about 180 degrees as the magnitude of the spurious response when a large number of acoustic wave resonators are configured according to the configuration of the acoustic wave device 1. The fractional band width is adjusted by changing the film thickness of the piezoelectric layer and the dimensions of the electrodes. FIG. 23 illustrates the results when a Z-cut $LiNbO_3$ piezoelectric layer is used, but the same or substantially the same tendency is obtained also when piezoelectric layers with other cut-angles are used.

In a region surrounded by an ellipse J in FIG. 23, the spurious response is as large as about 1.0. As is clear from FIG. 23, when the fractional band width exceeds about 0.17, that is, exceeds about 17%, a large spurious response with a spurious level of more than or equal to about 1 appears in a pass band even when the parameters defining the fractional band width are changed. That is, as in the resonance characteristics illustrated in FIG. 22, a large spurious response indicated by the arrow B appears within the band. Therefore, the fractional band width is, for example, preferably less than or equal to about 17%. In this case, the spurious response can be reduced by adjusting the film thickness of the piezoelectric layer 2, the dimensions of the electrodes 3 and 4, or the like.

Figure 24:
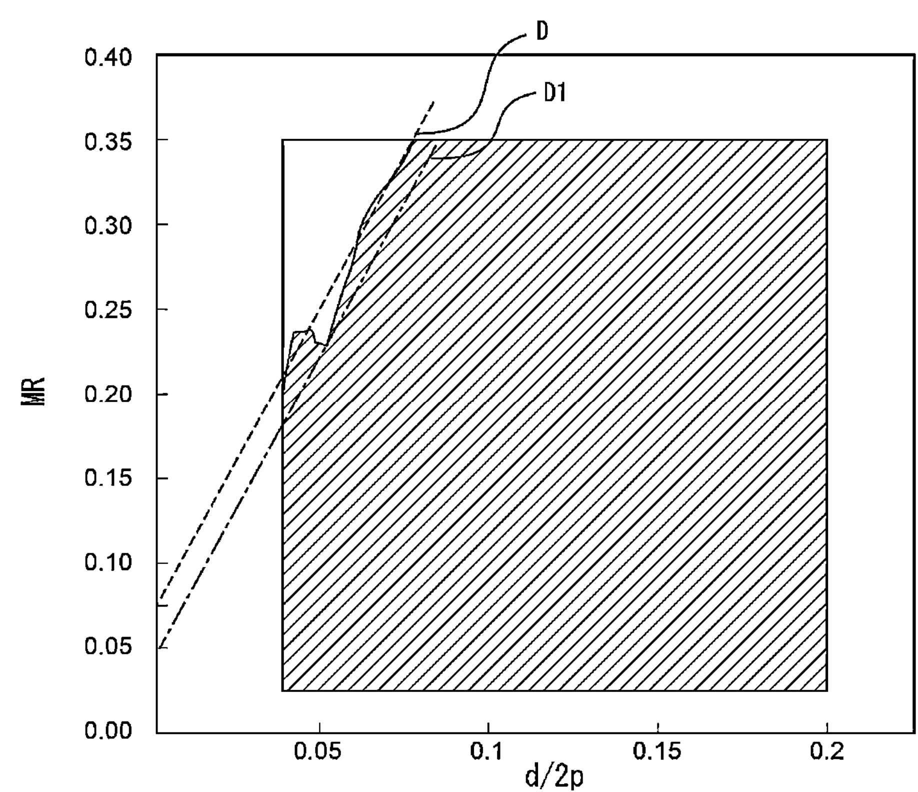
FIG. 24 is a diagram illustrating a relationship between d/2p and a metallization ratio MR.

FIG. 24 is a diagram illustrating a relationship among d/2p, the metallization ratio MR, and the fractional band width. In the acoustic wave device, various acoustic wave devices having different values of d/2p and different values of MR are provided, and the fractional band width is measured. A hatched portion to the right of a dashed line D illustrated in FIG. 24 is a region where the fractional band width is less than or equal to about 17%. The boundary between the hatched region and the non-hatched region is represented by MR=about 3.5(d/2p)+0.075. That is, MR=about 1.75(d/p)+0.075. Therefore, for example, MR 5 about 1.75(d/p)+0.075 is preferably satisfied. In this case, the fractional band width is easily set to less than or equal to about 17%. More preferably, for example, it is the region in FIG. 24 to the right of a dashed-dotted line D1 indicating MR=about 3.5(d/2p)+0.05. That is, when MR ≤about 1.75 (d/p)+0.05, the fractional band width can be reliably set to less than or equal to about 17%.

Figure 25:
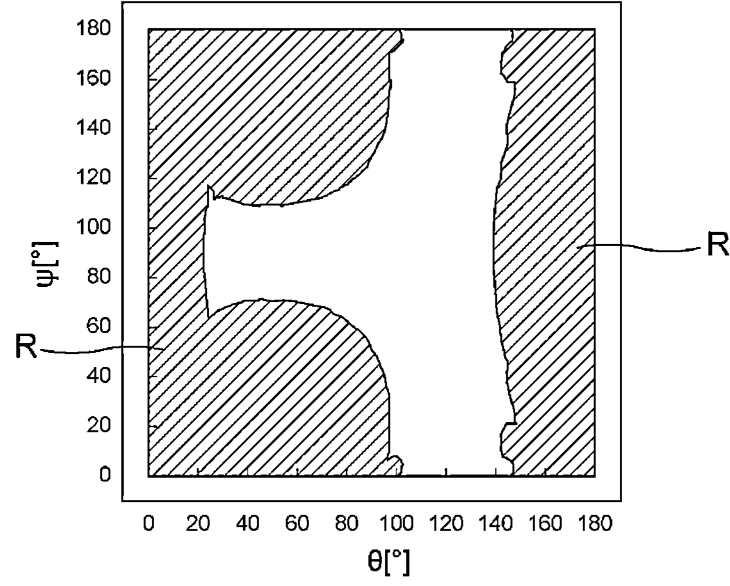
FIG. 25 is a diagram illustrating a map of the fractional band width with respect to Euler angles (0°, θ, ψ) of $LiNbO_3$ when d/p is infinitely close to 0.

FIG. 25 is a diagram illustrating a map of the fractional band width with respect to the Euler angles (0°, θ, ψ) of $LiNbO_3$ when d/p is infinitely close to 0. A plurality of hatched regions R illustrated in FIG. 25 are regions where the fractional band width of more than or equal to about 2% is obtained. When φ in the Euler angles (φ, θ, ψ) is within the range of about 0°±5°, the relationship between θ and ψ and the fractional band width is the same or substantially the same as that illustrated in FIG. 25. Also when the piezoelectric layer is made of, for example, lithium tantalate ($LiTaO_3$), the relationship between θ and ψ in the Euler angles (within the range of 0°±5°, θ, ψ) and BW is the same or substantially the same as that illustrated in FIG. 25.

Therefore, for example, when φ in the Euler angles (φ, θ, ψ) of the lithium niobate or lithium tantalate constituting the piezoelectric layer is within the range of about 0°±5° and θ and φ are within the range of any of the regions R illustrated in FIG. 25, the fractional band width can be sufficiently widened, which is preferable.

Figure 26:
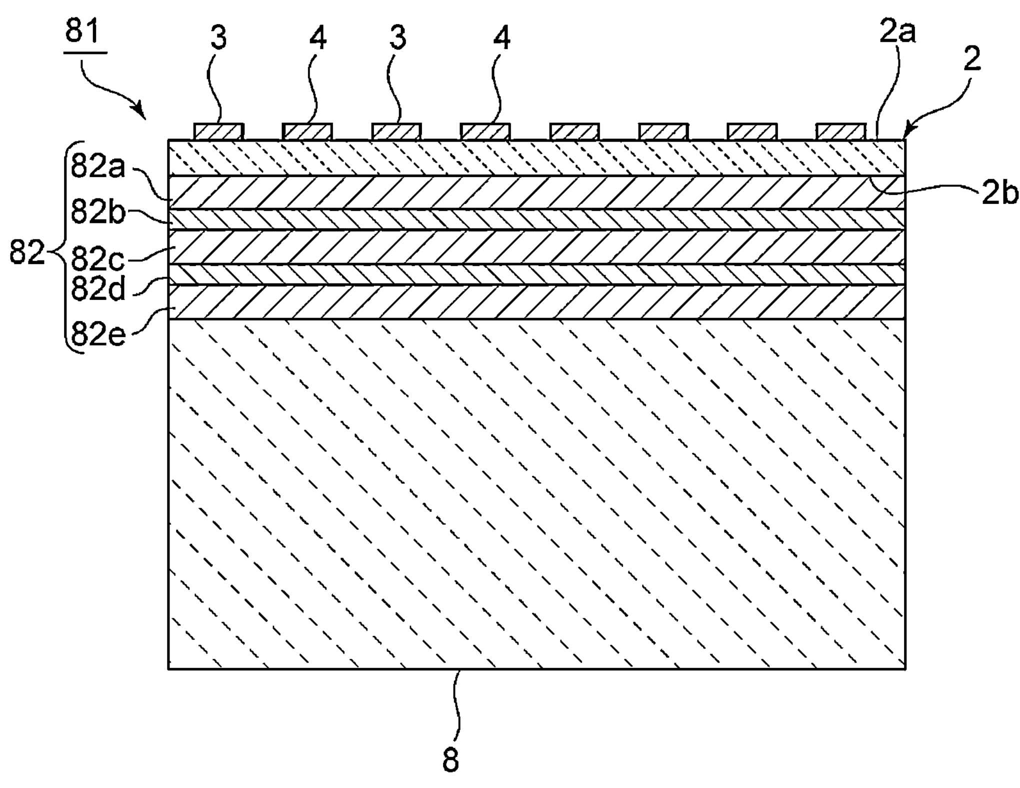
FIG. 26 is an elevational cross-sectional view of an acoustic wave device including an acoustic multilayer film.

FIG. 26 is an elevational cross-sectional view of an acoustic wave device including an acoustic multilayer film.

In an acoustic wave device 81, an acoustic multilayer film 82 is laminated on a second main surface 2*b* of a piezoelectric layer 2. The acoustic multilayer film 82 has a multilayer structure including low acoustic impedance layers 82*a*, 82*c*, and 82*e* with a relatively low acoustic impedance and high acoustic impedance layers 82*b* and 82*d* with a relatively high acoustic impedance. Using the acoustic multilayer film 82 makes it possible to confine the thickness-shear mode bulk wave in the piezoelectric layer 2 without using the cavity 9 in the acoustic wave device 1. In acoustic wave device 81, for example, resonance characteristics based on the thickness-shear mode bulk wave can be obtained by setting the above d/p to less than or equal to about 0.5. In the acoustic multilayer film 82, the number of the low acoustic impedance layers 82*a*, 82*c*, and 82*e* and high acoustic impedance layers 82*b* and 82*d* laminated is not particularly limited. It is sufficient that at least one high acoustic impedance layer 82*b* or 82*d* is disposed farther from the piezoelectric layer 2 than the low acoustic impedance layers 82*a*, 82*c*, and 82*e*.

The low acoustic impedance layers 82*a*, 82*c*, and 82*e* and the high acoustic impedance layers 82*b* and 82*d* can be made of any appropriate material as long as the above acoustic impedance relationship is satisfied. Examples of the material of the low acoustic impedance layers 82*a*, 82*c*, and 82*e* include silicon oxide or silicon oxynitride, and the like. Alumina, silicon nitride, metal or the like can be used as the material of the high acoustic impedance layers 82*b* and 82*d*.

Figure 27:
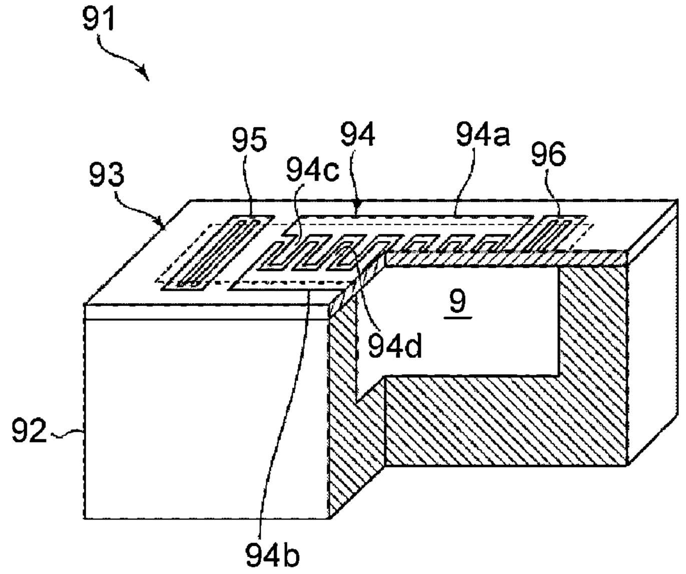
FIG. 27 is a partially cutaway perspective view for explaining an acoustic wave device that uses a Lamb wave.

FIG. 27 is a partially cutaway perspective view for explaining an acoustic wave device that uses a Lamb wave.

An acoustic wave device 91 includes a support substrate 92. The support substrate 92 is provided with a recessed portion that is open on its upper surface. A piezoelectric layer 93 is laminated on the support substrate 92. A cavity 9 is thus provided. An IDT electrode 94 is provided on the piezoelectric layer 93 above the cavity 9. On both sides of the IDT electrode 94 in the acoustic wave propagation direction, reflectors 95 and 96 are provided. In FIG. 27, an outer periphery of the cavity 9 is indicated by a dashed line. Here, the IDT electrode 94 includes first and second busbars 94*a* and 94*b*, a plurality of first electrode fingers 94*c*, and a plurality of second electrode fingers 94*d*. The plurality of first electrode fingers 94*c* are connected to the first busbar 94*a*. The plurality of second electrode fingers 94*d* are connected to the second busbar 94*b*. The plurality of first electrode fingers 94*c* and the plurality of second electrode fingers 94*d* are interdigitated with each other.

In the acoustic wave device 91, a Lamb wave as a plate wave is excited by applying an AC electric field to the IDT electrode 94 above the cavity 9. Since the reflectors 95 and 96 are provided on both sides, resonance characteristics due to the Lamb wave can be obtained.

In the acoustic wave devices of the first to fourth example embodiments and modifications, for example, the acoustic multilayer film 82 illustrated in FIG. 26 may be provided as an acoustic reflection film between the support and the piezoelectric layer. Specifically, the support and the piezoelectric layer may be arranged such that at least a portion of the support and at least a portion of the piezoelectric layer face each other across the acoustic multilayer film 82. In this case, it is sufficient that low acoustic impedance layers and high acoustic impedance layers are alternately laminated in the acoustic multilayer film 82. The acoustic multilayer film 82 may be an acoustic reflection portion in the acoustic wave device.

In the acoustic wave devices according to the first to fourth example embodiments and modifications that use the thickness-shear mode bulk wave, as described above, d/p is, for example, preferably less than or equal to about 0.5, and more preferably less than or equal to about 0.24. This makes it possible to obtain even better resonance characteristics.

Furthermore, in the excitation region of the acoustic wave devices according to the first to fourth example embodiments and modifications that use the thickness-shear mode bulk wave, as described above, for example, MR ≤about 1.75(d/p)+0.075 is preferably satisfied. More specifically, MR ≤about 1.75(d/p)+0.075 is preferably satisfied, where MR is the metallization ratio of the first and third electrode fingers and the second and third electrode fingers to the excitation region. In this case, spurious can be more reliably suppressed.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a piezoelectric layer including lithium niobate;

a first comb-shaped electrode on the piezoelectric layer, including a first busbar and a plurality of first electrode fingers each including one end connected to the first busbar, and being connected to an input potential;

a second comb-shaped electrode on the piezoelectric layer, including a second busbar and a plurality of second electrode fingers each including one end connected to the second busbar and interdigitated with the plurality of first electrode fingers, and being connected to an output potential; and a reference potential electrode including a plurality of third electrode fingers on the piezoelectric layer and aligned with the first electrode fingers and the second electrode fingers in a direction in which the first electrode fingers and the second electrode fingers are aligned, and a connection electrode connecting adjacent third electrode fingers, the reference potential electrode being connected to a reference potential; wherein a first electrode finger, a second electrode finger, and a third electrode finger are arranged such that, starting from the first electrode finger, the first electrode finger, the third electrode finger, the second electrode finger, and the third electrode finger define one period; and the acoustic wave device further includes:

a pair of reflectors, each including at least one reflector electrode finger, on the piezoelectric layer sandwiching a region where the first electrode finger, the second electrode finger, and the third electrode finger are provided in an electrode finger orthogonal direction orthogonal or substantially orthogonal to a direction in which the first electrode finger, the second electrode finger, and the third electrode finger extend.

2. The acoustic wave device according to claim 1, further comprising:

a support laminated on the piezoelectric layer; wherein an acoustic reflection portion is provided at a position on the support overlapping with the plurality of first electrode fingers, the plurality of second electrode fingers, and the plurality of third electrode fingers in plan view along a lamination direction of the support and the piezoelectric layer; and d/p is less than or equal to about 0.5, where p is the longest distance of the center-to-center distance between the first electrode finger and the third electrode finger adjacent to each other and the center-to-center distance between the second electrode finger and the third electrode finger adjacent to each other, and d is a thickness of the piezoelectric layer.

3. The acoustic wave device according to claim 2, wherein the support includes a support substrate and an insulating layer interposed between the support substrate and the piezoelectric layer.

4. The acoustic wave device according to claim 3, wherein the support substrate includes silicon.

5. The acoustic wave device according to claim 3, wherein the insulating layer includes silicon oxide or tantalum oxide.

6. The acoustic wave device according to claim 2, wherein d/p is less than or equal to about 0.24.

7. The acoustic wave device according to claim 2, wherein the acoustic reflection portion includes a cavity, and the support and the piezoelectric layer are provided such that a portion of the support and a portion of the piezoelectric layer face each other across the cavity.

8. The acoustic wave device according to claim 2, wherein the acoustic reflection portion includes an acoustic reflection film including a high acoustic impedance layer with a relatively high acoustic impedance and a low acoustic impedance layer with a relatively low acoustic impedance; and the support and the piezoelectric layer are provided such that at least a portion of the support and at least a portion of the piezoelectric layer face each other across the acoustic reflection film.

9. The acoustic wave device according to claim 2, wherein an excitation region is a region where the first electrode finger and the third electrode finger adjacent to each other overlap each other in the electrode finger orthogonal direction and a region between the centers of the first electrode finger and the third electrode finger adjacent to each other, as well as a region where the second electrode finger and the third electrode finger adjacent to each other overlap each other in the electrode finger orthogonal direction and a region between the centers of the second electrode finger and the third electrode finger adjacent to each other; and MR ≤about 1.75(d/p)+0.075 is satisfied, where MR is a metallization ratio of the first electrode finger and the third electrode finger, as well as the second electrode finger and the third electrode finger to the excitation region.

10. The acoustic wave device according to claim 1, wherein each of the first and second comb-shaped electrodes includes a multilayer metal film.

11. The acoustic wave device according to claim 10, wherein the multilayer metal film includes a first Ti layer, an AlCu layer on the first Ti layer, and a second Ti layer on the AlCu layer.

12. The acoustic wave device according to claim 1, wherein the reflectors each include more than or equal to eight of the reflector electrode fingers.

13. The acoustic wave device according to claim 1, wherein a center-to-center distance between the first electrode finger and the third electrode finger adjacent to each other and a center-to-center distance between the second electrode finger and the third electrode finger adjacent to each other are constant or substantially constant; and p1≠p2, where p1 is the center-to-center distance between the first electrode finger and the third electrode finger adjacent to each other and the center-to-center distance between the second electrode finger and the third electrode finger adjacent to each other, and p2 is a center-to-center distance between the electrode finger located at the outermost side portion in the electrode finger orthogonal direction and the reflector electrode finger located at the innermost side portion in the electrode finger orthogonal direction, among the first electrode finger, the second electrode finger, and the third electrode finger.

14. The acoustic wave device according to claim 1, wherein the pair of reflectors each include a plurality of reflector electrode fingers;

a center-to-center distance between the first electrode finger and the third electrode finger adjacent to each other and a center-to-center distance between the second electrode finger and the third electrode finger adjacent to each other are constant; and p1≠p3, where p1 is the center-to-center distance between the first electrode finger and the third electrode finger adjacent to each other and the center-to-center distance between the second electrode finger and the third electrode finger adjacent to each other and p3 is a center-to-center distance between the reflector electrode fingers adjacent to each other.

15. The acoustic wave device according to claim 1, wherein the plurality of first electrode fingers, the plurality of second electrode fingers, and the plurality of third electrode fingers have the same or substantially the same width; and w1≠w2, where w1 is the width of the first electrode finger, the second electrode finger, and the third electrode finger and w2 is a width of the reflector electrode finger.

16. The acoustic wave device according to claim 1, wherein the reflector is connected to any one of the output potential, the input potential, and the reference potential.

17. The acoustic wave device according to claim 1, wherein the reflector is not connected to any of the output potential, the input potential, and the reference potential.

18. The acoustic wave device according to claim 1, wherein the acoustic wave device is structured to generate a plate wave.

19. The acoustic wave device according to claim 1, wherein the acoustic wave device is structured to generate a thickness-shear mode bulk wave.

20. The acoustic wave device according to claim 1, wherein

Euler angles (φ, θ, ψ) of the lithium niobate of the piezoelectric layer are within the range of the Expression (1), Expression (2), or Expression (3):

(within the range of 0°±10°, 0° to 25°, any ψ) Expression (1);

(within the range of 0°±10°, 25° to 100°, $75° [(1-(\theta-50)^2/2500)]^{1/2}$ or $180°-75° [(1-(\theta-50)^2/2500)]^{1/2}$ to 180°) Expression (2); and (within the range of 0°±10°, $180°-40° [(1-(\psi-90)^2/8100)]^{1/2}$ to 180°, any ψ) Expression (3).

* * * * *